US012812878B2

(12) United States Patent
Seo

(10) Patent No.: US 12,812,878 B2
(45) Date of Patent: Nov. 24, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventor: Dahhye Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 502 days.

(21) Appl. No.: 18/483,543

(22) Filed: Oct. 10, 2023

(65) Prior Publication Data

US 2024/0315057 A1 Sep. 19, 2024

(30) Foreign Application Priority Data

Mar. 13, 2023 (KR) ........................ 10-2023-0032761

(51) Int. Cl.

*H10B 80/00* (2026.01)
*H10B 41/27* (2023.01)
*H10B 43/27* (2023.01)
*H10W 80/00* (2026.01)
*H10W 90/00* (2026.01)

(52) U.S. Cl.

CPC ............. *H10B 80/00* (2023.02); *H10B 41/27* (2023.02); *H10B 43/27* (2023.02); *H10W 90/00* (2026.01); *H10W 80/312* (2026.01); *H10W 80/327* (2026.01); *H10W 90/792* (2026.01)

(58) Field of Classification Search

CPC ................................ H10B 41/27; H10B 43/27
See application file for complete search history.

(56) References Cited

U.S. PATENT DOCUMENTS

| | | | | |
|---|---|---|---|---|
| 8,971,118 | B2 | 3/2015 | Jin et al. | |
| 11,164,633 | B2 | 11/2021 | Huo et al. | |
| 11,417,621 | B2 | 8/2022 | Hosoda et al. | |
| 11,469,242 | B2 | 10/2022 | Lee | |
| 2008/0242084 | A1 | 10/2008 | Kim et al. | |
| 2020/0350321 | A1* | 11/2020 | Cheng | H10B 10/12 |
| 2021/0391289 | A1 | 12/2021 | Kim et al. | |
| 2022/0013518 | A1 | 1/2022 | Kim et al. | |
| 2022/0068882 | A1* | 3/2022 | Xiao | H10W 90/00 |
| 2022/0302149 | A1 | 9/2022 | Zhang et al. | |
| 2022/0344244 | A1* | 10/2022 | Ryu | H10B 41/10 |
| 2022/0359564 | A1* | 11/2022 | Oh | H10B 43/27 |
| 2022/0406811 | A1* | 12/2022 | Arai | H10B 43/10 |

FOREIGN PATENT DOCUMENTS

CN 113035884 A 6/2021

* cited by examiner

*Primary Examiner* — Matthew L Reames
(74) *Attorney, Agent, or Firm* — Wolf, Greenfield & Sacks, P.C.

(57) ABSTRACT

A semiconductor device may include a semiconductor substrate, a peripheral circuit structure on the semiconductor substrate, and a cell array structure on the peripheral circuit structure. The cell array structure may comprise a stack, a first upper insulating layer on the stack, vertical channel patterns that extend through the stack and the first upper insulating layer, and a source structure on the first upper insulating layer and connected to the vertical channel patterns. The source structure may include a first semiconductor layer. The first semiconductor layer may include a plate portion on the first upper insulating layer, and a via portion that extends through the first upper insulating layer and is connected to the vertical channel patterns.

18 Claims, 32 Drawing Sheets

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2023-0032761, filed on Mar. 13, 2023, in the Korean Intellectual Property Office, the entire contents of which are hereby incorporated by reference.

TECHNICAL FIELD

The present disclosure relates to a semiconductor device and an electronic system including the same.

BACKGROUND

A semiconductor device configured to store a large amount of data is desirable. Accordingly, many studies are being conducted to increase the data storage capacity of the semiconductor device. For example, semiconductor devices, in which memory cells are three-dimensionally arranged, are being studied.

SUMMARY

An embodiment of the present disclosure provides a semiconductor device with improved electrical and reliability characteristics.

An embodiment of the present disclosure provides an electronic system including the semiconductor device.

According to an embodiment of the present disclosure, a semiconductor device may include a semiconductor substrate, a peripheral circuit structure on the semiconductor substrate, and a cell array structure on the peripheral circuit structure. The cell array structure comprises a stack comprising interlayer insulating layers and conductive patterns that are vertically and alternately stacked, a first upper insulating layer on the stack, vertical channel patterns that extend through the stack and the first upper insulating layer, and a source structure on the first upper insulating layer and connected to the vertical channel patterns. The source structure may include a first semiconductor layer. The first semiconductor layer may include a plate portion on the first upper insulating layer and a via portion that extends through the first upper insulating layer and is connected to the vertical channel patterns.

According to an embodiment of the present disclosure, a semiconductor device may include a semiconductor substrate, a peripheral circuit structure on the semiconductor substrate, and a cell array structure on the peripheral circuit structure. The cell array structure comprises a stack including interlayer insulating layers and conductive patterns that are vertically and alternately stacked, an upper insulating layer on the stack, vertical structures that extend through the stack and the upper insulating layer, each of the vertical structures including a vertical channel pattern and a data storage pattern on the vertical channel pattern, a source structure on the upper insulating layer and connected to the vertical channel patterns of the vertical structures, and a peripheral contact plug laterally spaced apart from the stack and the source structure and connected to the peripheral circuit structure. The peripheral contact plug includes a first protruding portion that extends through the upper insulating layer, and the upper insulating layer is on the data storage pattern and a side surface of the first protruding portion.

According to an embodiment of the present disclosure, an electronic system may include a semiconductor device including a semiconductor substrate, a peripheral circuit structure on the semiconductor substrate, a cell array structure on the peripheral circuit structure, and a controller that is electrically connected to the semiconductor device through an input/output pad. The peripheral circuit structure includes peripheral circuits that are integrated on the semiconductor substrate and first bonding pads that are connected to the peripheral circuits. The cell array structure includes second bonding pads connected to the first bonding pads, a stack on the second bonding pads, the stack including interlayer insulating layers and conductive patterns that are vertically and alternately stacked on the second bonding pads, an upper insulating layer on the stack, vertical structures that extend through the stack and the upper insulating layer, and a source structure on the upper insulating layer and connected to the vertical structures. The source structure includes a first semiconductor layer and a second semiconductor layer on the first semiconductor layer. The second semiconductor layer includes a plate portion and a via portion that extends through the upper insulating layer and is connected to the vertical structure. Each of the vertical structures include a vertical channel pattern and a data storage pattern on the vertical channel pattern, and a distance of an upper surface of the data storage pattern from the semiconductor substrate is greater than a distance of an upper surface of the vertical channel pattern from the semiconductor substrate.

DETAILED DESCRIPTION

Figure 1:
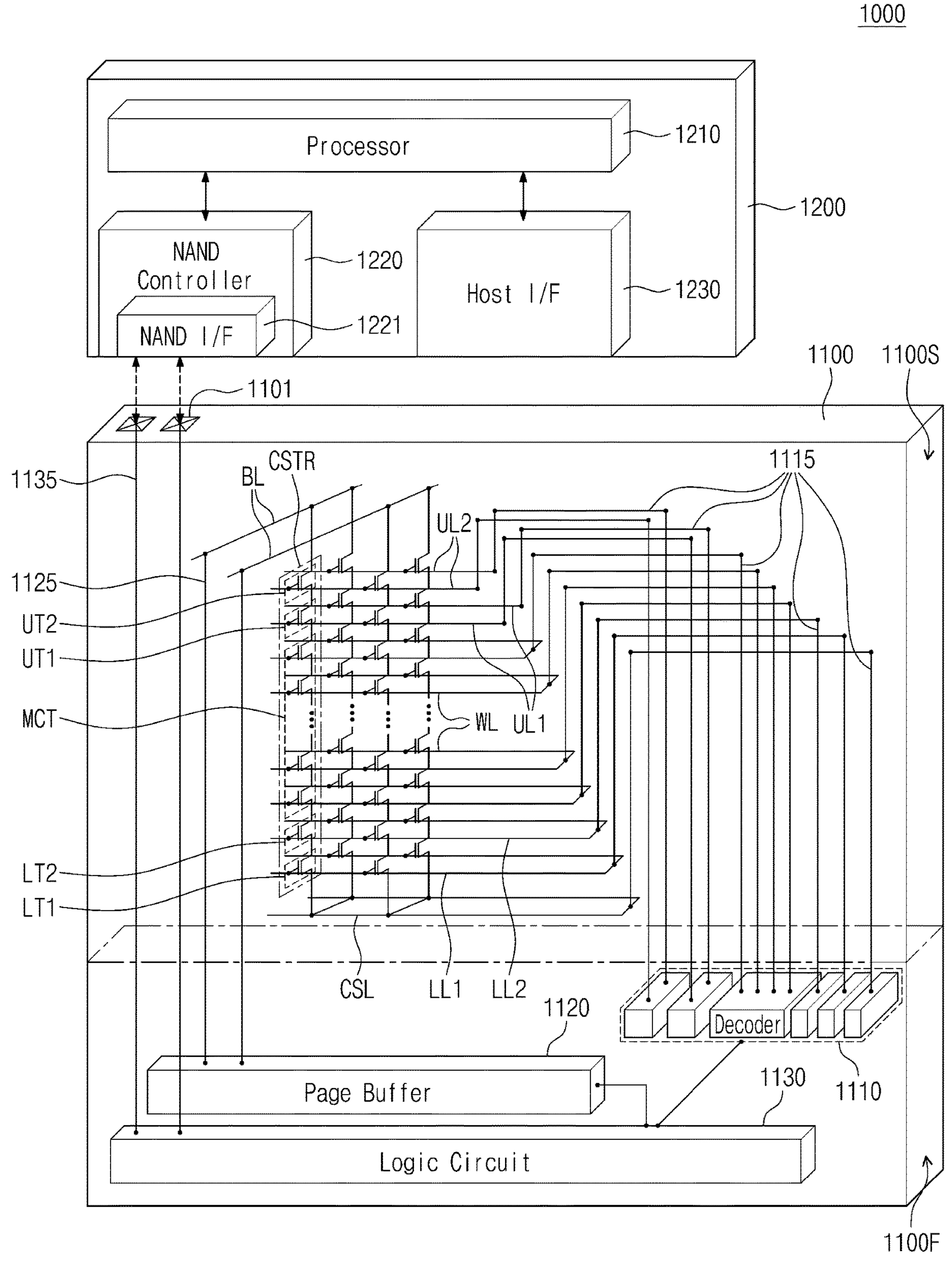
FIG. 1 is a diagram schematically illustrating an electronic system including a semiconductor device according to an embodiment of the present disclosure.

Example embodiments of the present disclosures will now be described more fully with reference to the accompanying drawings, in which example embodiments are shown.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. As used herein, "an element A is at a same level as element B" refers to at least one surface of element A that is coplanar with at least one surface of element B. The term "connected" may be used herein to refer to a physical and/or electrical connection and may refer to a direct or indirect physical and/or electrical connection.

FIG. 1 is a diagram schematically illustrating an electronic system including a semiconductor device according to an embodiment of the present disclosure.

Referring to FIG. 1, an electronic system 1000 according to an embodiment of the present disclosure may include a semiconductor device 1100 and a controller 1200, which is electrically connected to the semiconductor device 1100. The electronic system 1000 may be a storage device, which includes one or more semiconductor devices 1100, or an electronic device, which includes the storage device. For example, the electronic system 1000 may be a solid state drive (SSD) device, universal serial bus (USB) drive, computing system, medical system, or communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be proximate to (i.e., adjacent and/or near) the second structure 1100S.

The first structure 1100F may be a peripheral circuit structure, which includes a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may vary and are not limited to the numbers illustrated in FIG. 1.

In an embodiment, the upper transistors UT1 and UT2 may include at least one string selection transistor, and the lower transistors LT1 and LT2 may include at least one ground selection transistor. The first and second gate lower lines LL1 and LL2 may correspond to gate electrodes of the lower transistors LT1 and LT2, respectively. The word lines WL may correspond to gate electrodes of the memory cell transistors MCT, and the first and second gate upper lines UL1 and UL2 may correspond to gate electrodes of the upper transistors UT1 and UT2, respectively.

In an embodiment, the lower transistors LT1 and LT2 may include a lower erase control transistor and a ground selection transistor, which are connected in series. The upper transistors UT1 and UT2 may include a string selection transistor and an upper erase control transistor, which are connected in series. At least one of the lower and upper erase control transistors may perform an erase operation to erase data of the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which extend from the first structure 1100F to the second structure 1100S. The bit lines BL may be electrically connected to the page buffer 1120 through second connection lines 1125, which extend from the first structure 1100F to the second structure 1100S.

The decoder circuit 1110 and the page buffer 1120 may be configured to perform a control operation on at least one transistor that is selected from the memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135, which is provided in the first structure 1100F and extends through the second structure 1100S.

Although not shown, the first structure 1100F may include a voltage generator that generates a program voltage, a read voltage, a pass voltage, a verification voltage, and so forth for operating the memory cell strings CSTR. Here, the program voltage may be a relatively high voltage (e.g., 20V to 40V), compared with the read voltage, the pass voltage, and the verification voltage.

In an embodiment, the first structure 1100F may include high voltage transistors and low voltage transistors. The decoder circuit 1110 may include pass transistors that are connected to the word lines WL of the memory cell strings CSTR. The pass transistors may include high-voltage transistors that can operate under a high voltage (e.g., the program voltage) applied to the word lines WL during a programming operation). The page buffer 1120 may also include high-voltage transistors that can operate under the high voltage.

The controller 1200 may include a processor 1210, a NAND controller 1220, and a host interface 1230. In an embodiment, the electronic system 1000 may include a plurality of semiconductor devices 1100, and in this case, the controller 1200 may control the semiconductor devices 1100.

The processor 1210 may control overall operations of the electronic system 1000 including the controller 1200. The processor 1210 may operate based on a specific firmware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands for controlling the semiconductor device 1100 and data to be written in or read from the memory cell transistors MCT of the semiconductor device 1100. The host interface 1230 may be configured to allow for communication between the electronic system 1000 and an external host. When a control command is received from an external host through the host interface 1230, the processor 1210 may control the semiconductor device 1100 in response to the control command.

Figure 2:
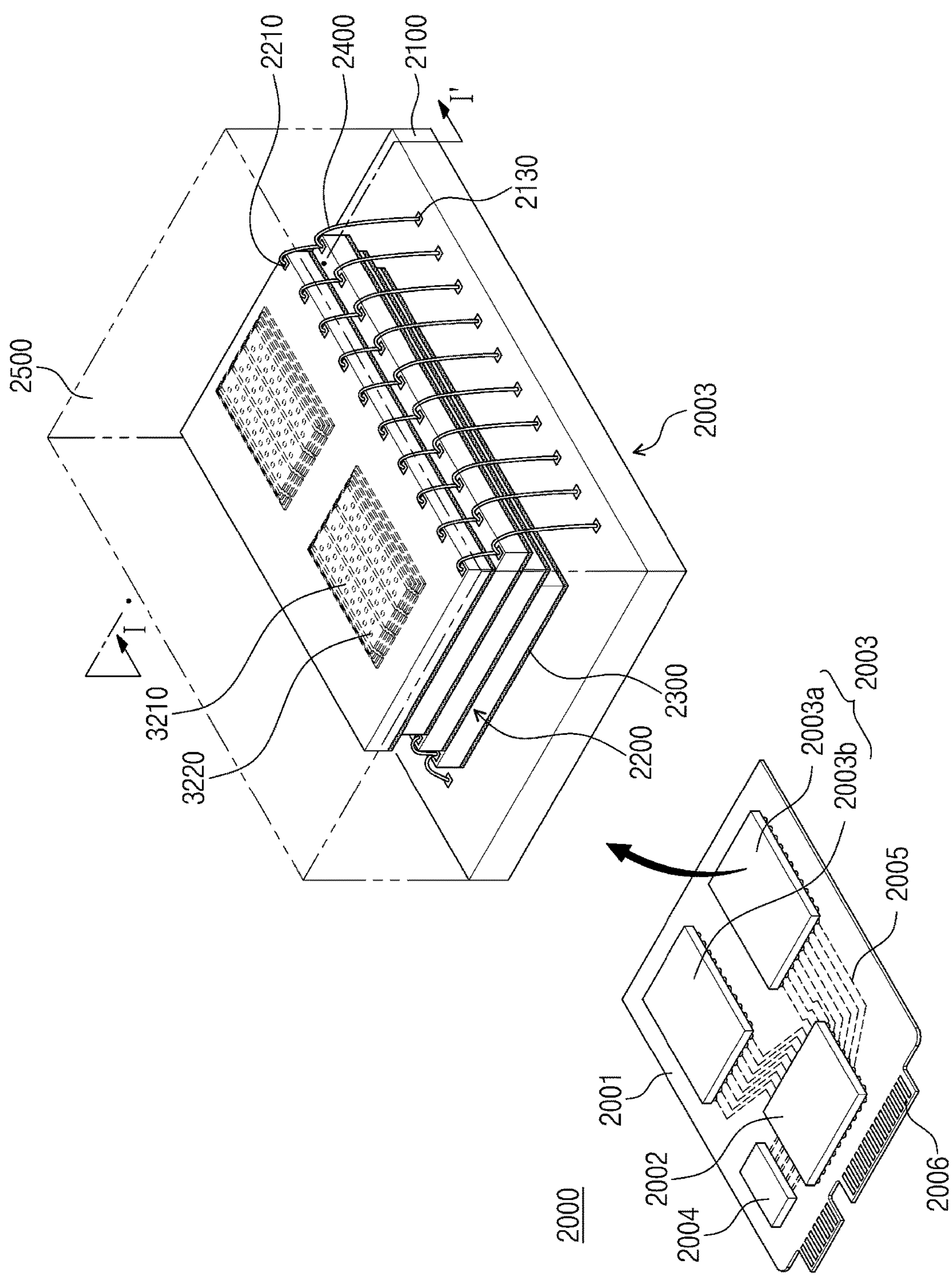
FIG. 2 is a perspective view schematically illustrating an electronic system including a semiconductor device according to an embodiment of the present disclosure.

FIG. 2 is a perspective view schematically illustrating an electronic system including a semiconductor device according to an embodiment of the present disclosure.

Referring to FIG. 2, an electronic system 2000 according to an embodiment of the present disclosure may include a main substrate 2001, a controller 2002, at least one semiconductor package 2003, and a DRAM 2004, which are mounted on the main substrate 2001. The semiconductor package 2003 and the DRAM 2004 may be connected to the controller 2002 through interconnection patterns 2005, which are formed in the main substrate 2001.

The main substrate 2001 may include a connector 2006, which includes a plurality of pins coupled to an external host. The number and arrangement of the pins of the connector 2006 may depend on a communication interface between the electronic system 2000 and the external host. In an embodiment, the electronic system 2000 may communicate with the external host, in accordance with one of interfaces, such as a universal serial bus (USB), peripheral component interconnect express (PCI-Express), serial advanced technology attachment (SATA), universal flash storage (UFS) M-Phy, or the like. In an embodiment, the electronic system 2000 may be driven by a power that is supplied from the external host through the connector 2006. The electronic system 2000 may further include a power management integrated circuit (PMIC) that is configured to separately supply an electric power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In an embodiment, the DRAM 2004 in the electronic system 2000 may serve as a cache memory and may be used as a storage space, which temporarily stores data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 respectively on bottom surfaces of the semiconductor chips 2200, a connection structure 2400 electrically connecting the semiconductor chips 2200 to the package substrate 2100, and a molding layer 2500 on the package substrate 2100 to cover the semiconductor chips 2200 and the connection structure 2400.

The package substrate 2100 may be a printed circuit board including upper pads 2130. Each of the semiconductor chips 2200 may include an input/output pad 2210. The input/output pad 2210 may correspond to the input/output pad 1101 of FIG. 1. Each of the semiconductor chips 2200 may include stacks 3210 and vertical structures 3220. Each of the semiconductor chips 2200 may include a semiconductor device, which will be described below, according to an embodiment of the present disclosure.

In an embodiment, the connection structure 2400 may include a bonding wire electrically connecting the input/ output pad 2210 to the upper pads 2130. Thus, in each of the first and second semiconductor packages 2003*a* and 2003*b*, the semiconductor chips 2200 may be electrically connected to each other in a bonding wire manner and may be electrically connected to the upper pads 2130 of the package substrate 2100. In an embodiment, the semiconductor chips 2200 in each of the first and second semiconductor packages 2003*a* and 2003*b* may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate and may be connected to each other through interconnection lines that are provided in the interposer substrate.

Figure 3:
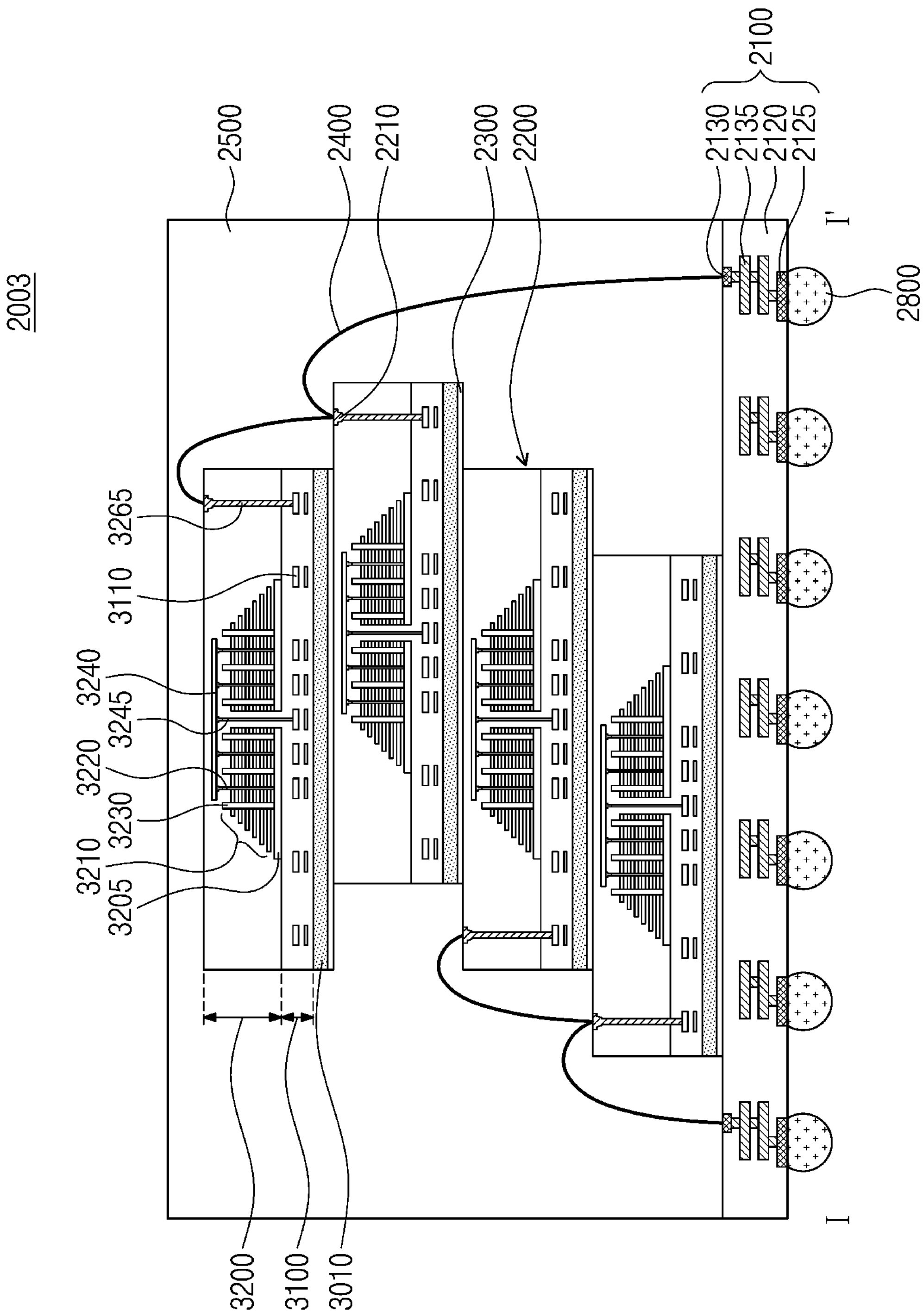
FIGS. 3 and 4 are sectional views schematically illustrating semiconductor packages according to an embodiment of the present disclosure.
Figure 4:
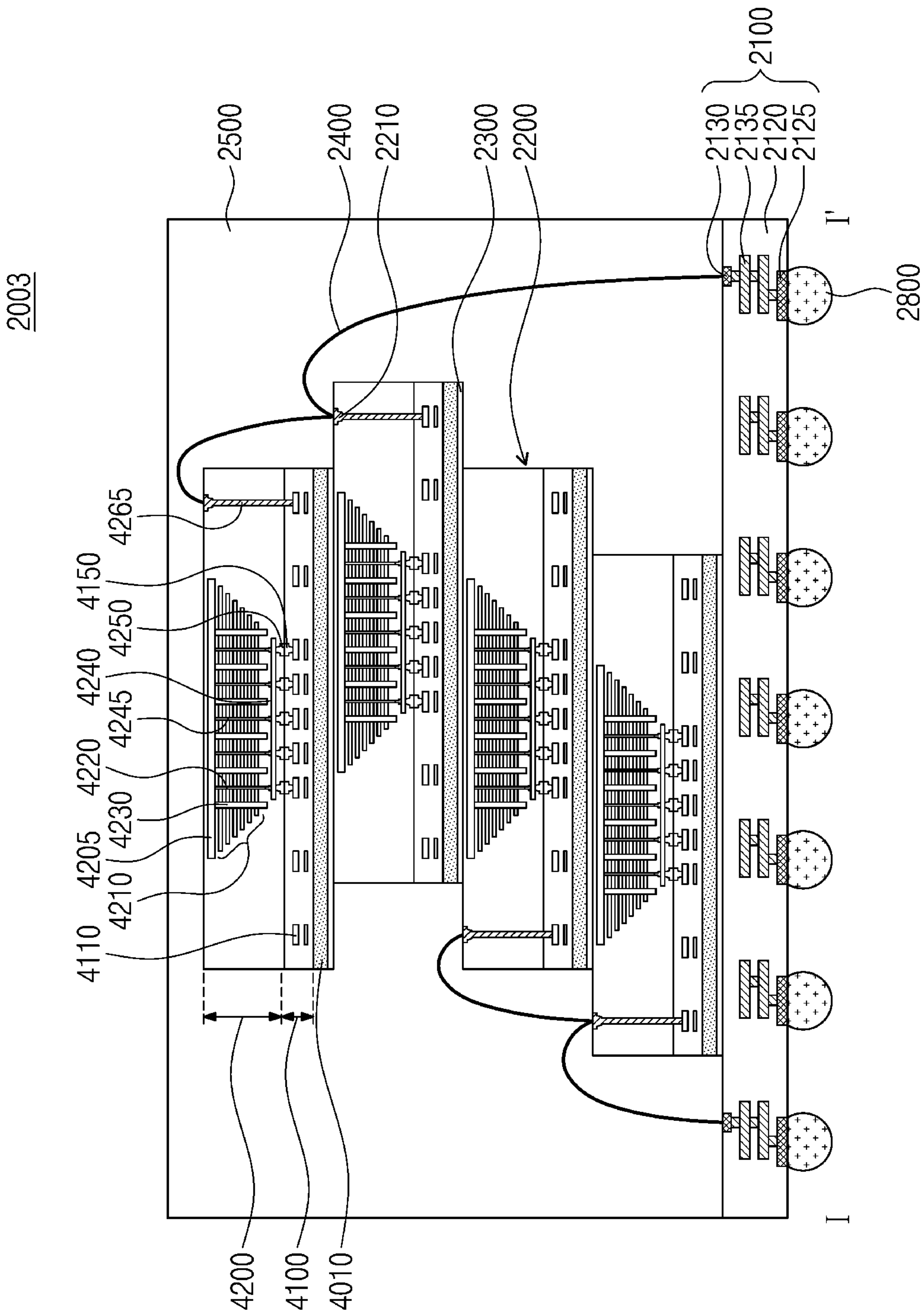

FIGS. 3 and 4 are sectional views schematically illustrating semiconductor packages according to an embodiment of the present disclosure. FIGS. 3 and 4 are sectional views, which are taken along a line I-I' of FIG. 2 to illustrate two different examples of the semiconductor package of FIG. 2.

Referring to FIG. 3, in the semiconductor package 2003, the package substrate 2100 may be a printed circuit board. The package substrate 2100 may include a package substrate body portion 2120 and the upper pads 2130, which are on a top surface of the package substrate body portion 2120 or are exposed to the outside of the package substrate body portion 2120 near the top surface of the package substrate body portion 2120. The package substrate 2110 may also include lower pads 2125, which are on or exposed through a bottom surface of the package substrate body portion 2120, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, a stack 3210 on the source structure 3205, vertical structures 3220, separation structures 3230 extending through the stack 3210, bit lines 3240 electrically connected to the vertical structures 3220, and cell contact plugs (not shown) electrically connected to the word lines WL (e.g., of FIG. 1) of the stack 3210.

Each of the semiconductor chips 2200 may include penetration lines 3245, which are electrically connected to the peripheral lines 3110 of the first structure 3100 and extend into the second structure 3200. The penetration line 3245 may be outside the stack 3210, and in an embodiment, the penetration line 3245 may be provided to extend through the stack 3210. Each of the semiconductor chips 2200 may further include input/output contact plug 3265, which are electrically connected to the peripheral lines 3110 of the first structure 3100, and the input/output pad 2210, which is electrically connected to the input/output contact plug 3265.

Referring to FIG. 4, in a semiconductor package 2003A, each of the semiconductor chips 2200 may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the first structure 4100 and the source structure 4205, vertical structures 4220, a separation structure 4230 extending through the stack 4210, and second junction structures 4250, which are electrically and respectively connected to the vertical structures 4220 and the word lines WL (e.g., see FIG. 1) of the stack 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs (not shown), which are electrically connected to the word lines WL (e.g., of FIG. 1). The first junction structures 4150 of the first structure 4100 may be in contact with and bonded to the second junction structures 4250 of the second structure 4200. The bonded portions of the first and second junction structures 4150 and 4250 may be formed of or include, for example, copper (Cu).

Each of the semiconductor chips 2200 may further include an input/output contact plug 4265, which is electrically connected to the peripheral lines 4110 of the first structure 4100, and the input/output pad 2210, which is electrically connected to the input/output contact plug 4265.

The semiconductor chips 2200 of FIG. 3 or 4 may be electrically connected to each other by the connection structures 2400, such as bonding wires. However, in an embodiment, semiconductor chips, which are provided in the same semiconductor package as the semiconductor chips 2200 of FIG. 3 or 4, may be electrically connected to each other by a connection structure including through silicon vias (TSVs).

The first structure 3100 or 4100 of FIG. 3 or 4 may correspond to a peripheral circuit structure PS in an embodiment to be described below, and the second structure 3200 or 4200 of FIG. 3 or 4 may correspond to a cell array structure CS in an embodiment to be described below.

Figure 5:
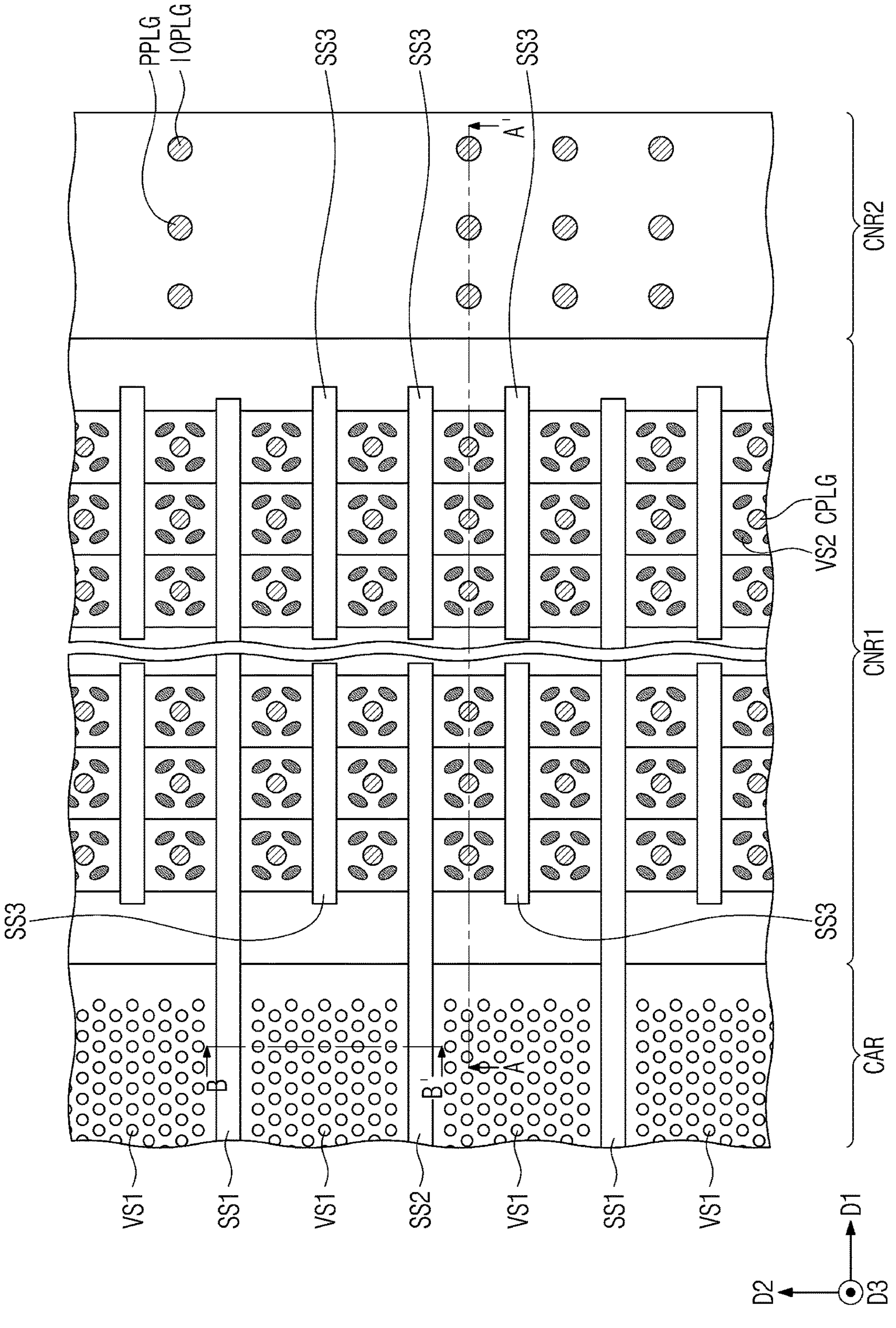
FIG. 5 is a plan view illustrating a semiconductor device according to an embodiment of the present disclosure.
Figure 6A:
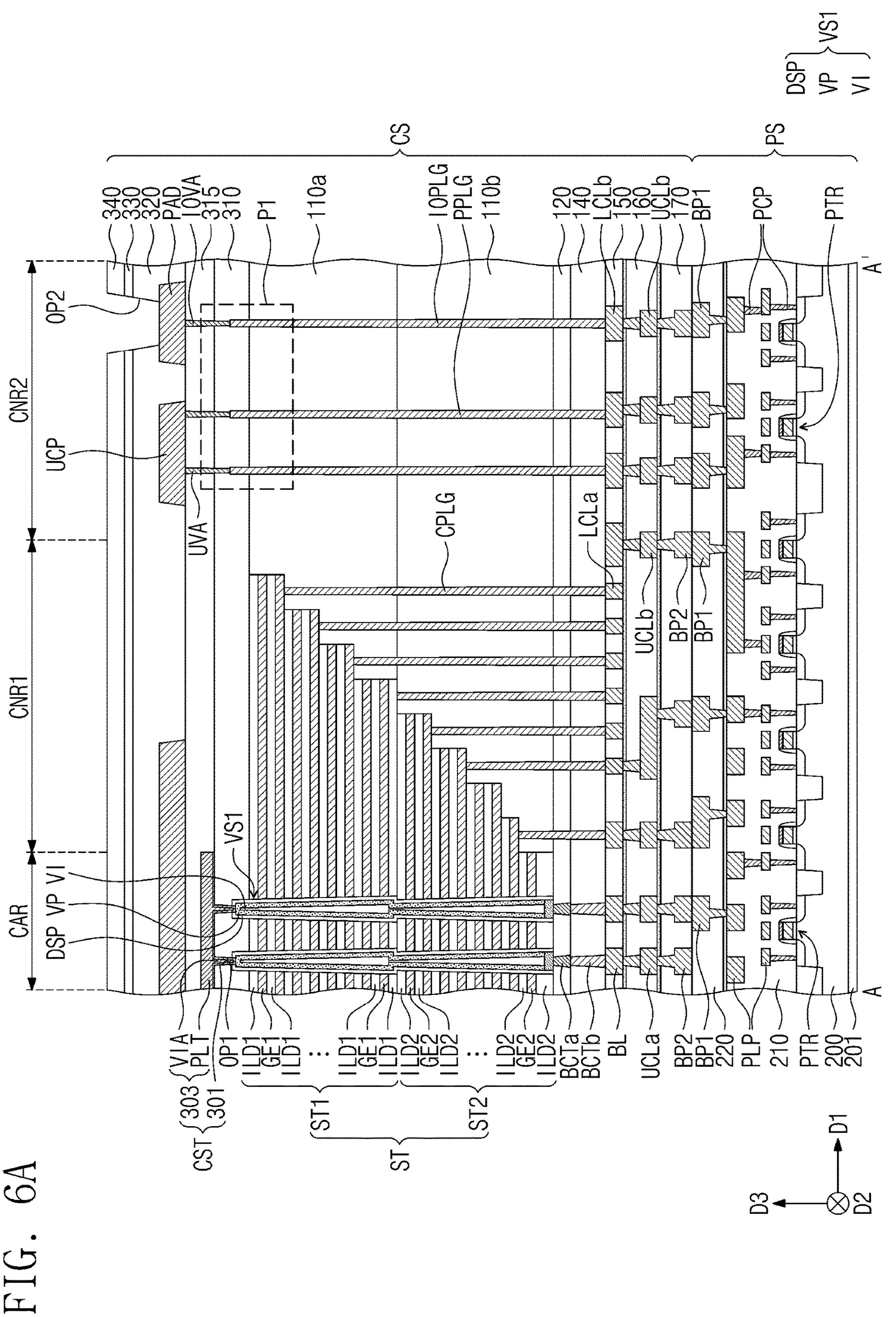
FIG. 6A is a sectional view that is taken along a line A-A' of FIG. 5 and illustrates a semiconductor device according to an embodiment of the present disclosure.
Figure 6B:
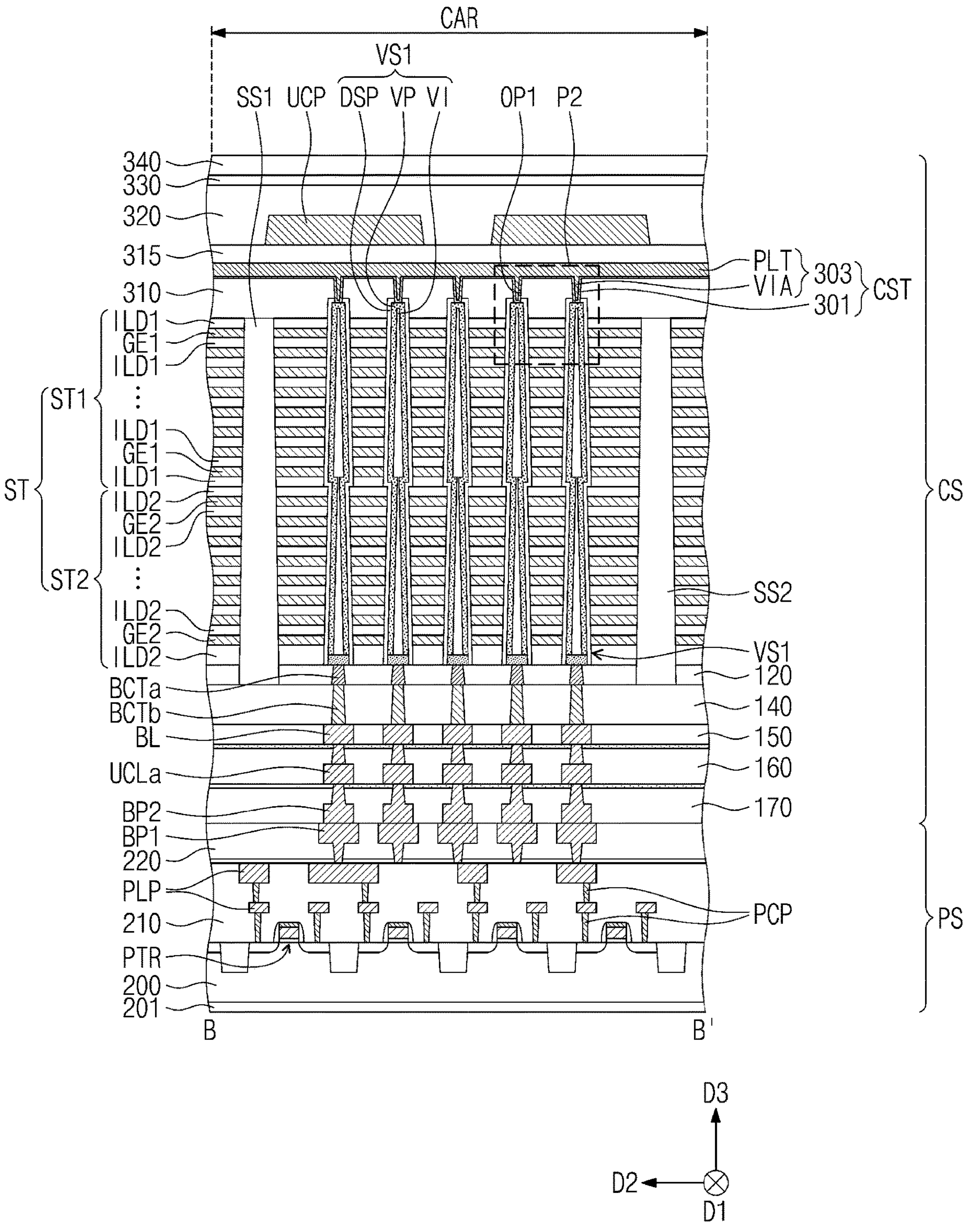
FIG. 6B is a sectional view that is taken along a line B-B' of FIG. 5 and illustrates a semiconductor device according to an embodiment of the present disclosure.

FIG. 5 is a plan view illustrating a semiconductor device according to an embodiment of the present disclosure. FIG. 6A is a sectional view, which is taken along a line A-A' of FIG. 5 to illustrate a semiconductor device according to an embodiment of the present disclosure. FIG. 6B is a sectional view, which is taken along a line B-B' of FIG. 5 to illustrate a semiconductor device according to an embodiment of the present disclosure.

Referring to FIGS. 5, 6A, and 6B, a semiconductor device according to an embodiment of the present disclosure may include the peripheral circuit structure PS on a semiconductor substrate 200 and a cell array structure CS on the peripheral circuit structure PS.

In an embodiment, since the cell array structure CS is placed on the peripheral circuit structure PS, a cell capacity per unit area in the semiconductor device may be increased. In addition, the peripheral circuit structure PS and the cell array structure CS may be separately fabricated and then may be coupled to each other, and in this case, it may be possible to prevent peripheral circuits PTR from being damaged by several thermal treatment processes. Accordingly, the semiconductor device may have improved electrical and reliability characteristics.

The peripheral circuit structure PS may correspond to the first structure 3100 of FIG. 3 and/or the first structure 4100 of FIG. 4. In one embodiment, the peripheral circuit structure PS may include the semiconductor substrate 200, the peripheral circuits PTR controlling a memory cell array, and peripheral circuit insulating layers 210 and 220 covering/on the peripheral circuits PTR. The peripheral circuits PTR may be integrated on a top surface of the semiconductor substrate 200. A surface insulating layer 201 may be provided on a rear surface of the semiconductor substrate 200.

The semiconductor substrate 200 may correspond to the semiconductor substrate 3010 of FIG. 3 and/or the semiconductor substrate 4010 of FIG. 4. The semiconductor substrate 200 may be a silicon substrate, a silicon-germanium substrate, a germanium substrate, or a structure including a single-crystalline silicon substrate and a single crystalline epitaxial layer grown therefrom. The semiconductor substrate 200 may have a top surface that is parallel to two different directions (e.g., a first direction D1 and a second direction D2) and is perpendicular to a third direction D3. For example, the first to third directions D1, D2, and D3 may be orthogonal to each other.

The peripheral circuits PTR may include row and column decoders, a page buffer, a control circuit, and so forth. In detail, the peripheral circuits PTR may include NMOS and PMOS transistors. Peripheral circuit lines PLP may be electrically connected to the peripheral circuits PTR through peripheral plugs PCP.

In an embodiment, widths of the peripheral plugs PCP in the first or second direction D1 or D2 may increase as a height in the third direction D3 increases. The peripheral plugs PCP and the peripheral circuit lines PLP may be formed of or include at least one of conductive materials (e.g., metallic materials).

The peripheral circuit insulating layers 210 and 220 may be provided on the top surface of the semiconductor substrate 200. The peripheral circuit insulating layers 210 and 220 on the semiconductor substrate 200 may cover the peripheral circuits PTR, the peripheral plugs PCP, and the peripheral circuit lines PLP. The peripheral plugs PCP and the peripheral circuit lines PLP may be electrically connected to the peripheral circuits PTR. Each of the peripheral circuit insulating layers 210 and 220 may include a silicon oxide layer, a silicon nitride layer, a silicon oxynitride layer, and/or a low-k dielectric layer.

First bonding pads BP1 may be in the uppermost peripheral circuit insulating layer 220. The uppermost peripheral circuit insulating layer 220 may not cover top surfaces of the first bonding pads BP1. A top surface of the uppermost peripheral circuit insulating layer 220 may be substantially coplanar with the top surfaces of the first bonding pads BP1. The first bonding pads BP1 may be electrically connected to the peripheral circuits PTR through the peripheral circuit lines PLP and the peripheral plugs PCP.

The cell array structure CS may be provided on the peripheral circuit structure PS. The cell array structure CS of the semiconductor device may correspond to the second structure 3200 of FIG. 3 and/or the second structure 4200 of FIG. 4. The cell array structure CS may include a cell array region CAR and first and second connection regions CNR1 and CNR2. The first connection region CNR1 may be between the cell array region CAR and the second connection region CNR2 in the first direction D1.

The cell array structure CS may include a memory cell array, in which memory cells are three-dimensionally arranged. In detail, the cell array structure CS may include a source structure CST, a stack ST, first and second vertical structures VS1 and VS2, bit lines BL, cell contact plugs CPLG, peripheral contact plugs PPLG, and input/output contact plugs IOPLG.

The cell array structure CS may include a plurality of stacks ST. The stacks ST may correspond to the stacks 3210 of FIG. 3 and/or the stacks 4210 of FIG. 4.

The stacks ST may extend in the first direction D1 and may be spaced apart from each other in the second direction D2. Hereinafter, just one stack ST will be described, for brevity's sake, but the others of the stacks ST may have substantially the same features as described below.

The stack ST may include conductive patterns GE1 and GE2 and interlayer insulating layers ILD1 and ILD2, which are alternately stacked in the third direction D3 (e.g., a vertical direction) that is perpendicular to the first and second directions D1 and D2.

In an embodiment, the conductive patterns GE1 and GE2 may include first and second erase gate patterns adjacent to the source structure CST, a ground selection gate pattern on the second erase gate pattern, a plurality of cell gate patterns stacked on the ground selection gate pattern, and a string selection gate pattern on the uppermost one of the cell gate patterns.

The conductive patterns GE1 and GE2 of the stack ST may be stacked to have an inverted staircase structure in the first connection region CNR1. For example, lengths of the conductive patterns GE1 and GE2 in the first direction D1 may increase as a distance from the peripheral circuit structure PS increases.

Each of the conductive patterns GE1 and GE2 may include a pad portion, which is provided in the first connection region CNR1. Each of the pad portions of the conductive patterns GE1 and GE2 may have a surface exposed to the outside of the interlayer insulating layers ILD1 and ILD2. The pad portions of the conductive patterns GE1 and GE2 may be located at different positions in horizontal and vertical directions. The cell contact plugs CPLG may be respectively coupled to the pad portions of the conductive patterns GE1 and GE2.

In an embodiment, the stack ST may include a first stack ST1 and a second stack ST2 under the first stack ST1. The first stack ST1 may include first interlayer insulating layers ILD1 and first conductive patterns GE1, which are alternately stacked on top of another, and the second stack ST2 may include second interlayer insulating layers ILD2 and second conductive patterns GE2, which are alternately stacked on top of another.

The second stack ST2 may be between the first stack ST1 and the peripheral circuit structure PS. More specifically, the second stack ST2 may be provided under a bottom surface of the lowermost one of the first interlayer insulating layers ILD1 of the first stack ST1. The uppermost one of the second interlayer insulating layers ILD2 of the second stack ST2 may be in contact with the lowermost one of the first interlayer insulating layers ILD1 of the first stack ST1, but the present disclosure is not limited to this example. For example, a single insulating layer may be provided between the uppermost one of the second conductive patterns GE2 of the second stack ST2 and the first conductive patterns GE1 of the first stack ST1.

The lowermost one of the second conductive patterns GE2 of the second stack ST2 may have the smallest length in the first direction D1, and the uppermost one of the first conductive patterns GE1 of the first stack ST1 may have the largest length in the first direction D1.

In an embodiment, the first and second conductive patterns GE1 and GE2 may be formed of or include at least one of doped semiconductor materials (e.g., doped silicon), metallic materials (e.g., tungsten, molybdenum, nickel, copper, and aluminum), conductive metal nitride materials (e.g., titanium nitride and tantalum nitride), or transition metals (e.g., titanium and tantalum). The first and second interlayer insulating layers ILD1 and ILD2 may be formed of or include at least one of silicon oxide, silicon nitride, silicon oxynitride, and/or low-k dielectric materials. For example, the first and second interlayer insulating layers ILD1 and ILD2 may be formed of or include high density plasma (HDP) oxide or tetraethylorthosilicate (TEOS).

In an embodiment, the semiconductor device may be a vertical-type NAND FLASH memory device, and in this case, the first and second conductive patterns GE1 and GE2 of the stack ST may be used as the first and second gate lower lines LL1 and LL2, the word lines WL, and the first and second gate upper lines UL1 and UL2 described with reference to FIG. 1.

Planarization insulating layers 110*a* and 110*b* may be provided to cover staircase end portions (i.e., the pad portions) of the stack ST. The planarization insulating layers 110*a* and 110*b* may have a substantially flat top surface. The planarization insulating layers 110*a* and 110*b* may include a single insulating layer or a plurality of stacked insulating layers. In an embodiment, the planarization insulating layers 110*a* and 110*b* may include a first planarization insulating layer 110*a*, which covers the staircase structure of the first stack ST1, and a second planarization insulating layer 110*b*, which covers the staircase structure of the second stack ST2. The planarization insulating layers 110*a* and 110*b* may have substantially flat top and bottom surfaces. The top surface of the planarization insulating layer 110*a* or 110*b* may be substantially coplanar with a top surface of the uppermost interlayer insulating layer ILD1 of the stack ST, and the bottom surface of the planarization insulating layer 110*a* or 110*b* may be substantially coplanar with a bottom surface of the lowermost interlayer insulating layer ILD2 of the stack ST.

A first upper insulating layer 310 may be on the stack ST and planarization insulating layers 110*a* and 110*b*. The first upper insulating layer 310 may cover the stack ST and uppermost surfaces of the planarization insulating layers 110*a* and 110*b*.

In an embodiment, a plurality of first vertical structures VS1 may extend through the stack ST in the cell array region CAR. The first vertical structures VS1 may correspond to the vertical structures 3220 of FIG. 3 and/or the vertical structures 4220 of FIG. 4.

The first vertical structures VS1 may extend into the first upper insulating layer 310. The first vertical structures VS1 may be arranged in a specific direction or in a zigzag shape, when viewed in a plan view. The second vertical structures VS2 may extend through the stack ST in the first connection region CNR1. The second vertical structures VS2 may extend into the first upper insulating layer 310.

In the first connection region CNR1, the second vertical structures VS2 may be provided to extend through the pad portions of the first and second conductive patterns GE1 and GE2. The second vertical structures VS2 may have substantially the same structure as the first vertical structures VS1 and may be formed of or include the same material as the first vertical structures VS1.

When viewed in a plan view, shapes and sizes of the second vertical structures VS2 may be different from those of the first vertical structures VS1. Top surfaces of the second vertical structures VS2 may have various shapes (e.g., circular, elliptical, and bar shapes). The second vertical structures VS2 may enclose each of the cell contact plugs CPLG. In the case where the second vertical structures VS2 have elliptical top surfaces, the second vertical structures VS2 in each pad portion of the first and second conductive patterns GE1 and GE2 may have long axes oriented in at least two different directions. In an embodiment, a plurality of the second vertical structures VS2 may be provided between adjacent ones of the cell contact plugs CPLG.

In an embodiment, each of the first vertical structures VS1 may be provided in a vertical channel hole penetrating the stack ST. In an embodiment, the vertical channel hole may include first vertical channel holes, which extend through the first stack ST1, and second vertical channel holes, which extend through the second stack ST2 and are connected to the first vertical channel holes.

Each of the first vertical structures VS1 may include a first vertical extended portion in the first vertical channel hole and a second vertical extended portion in the second vertical channel hole. The first and second vertical extended portions may be a single structure which is continuously extended without any observable interface. Here, the first vertical extended portion may have a side surface whose slope is substantially constant from top to bottom. Similarly, the second vertical extended portion may have a side surface whose slope is substantially constant from top to bottom. In other words, as a distance from the semiconductor substrate 200 increases, each of the first and second vertical extended portions may have a width decreasing in the first or second direction D1 or D2. The first and second vertical extended portions may have different diameters at a level of the interface therebetween. For example, the first and second vertical extended portions may be provided to form a stepwise structure near the interface therebetween.

However, the present disclosure is not limited to this example, and in an embodiment, each of the first vertical structures VS1 may include three or more vertical extended portions, which are provided to form the stepwise structure at two or more levels, unlike that illustrated in the drawings. Alternatively, each of the first vertical structures VS1 may be provided to have a flat side surface without any stepwise portion.

Each of the first vertical structures VS1 may include a vertical channel pattern VP, a data storage pattern DSP, and a vertical insulating pattern VI.

In detail, the vertical channel pattern VP may have a cylindrical shape with closed top and bottom portions. The vertical channel pattern VP may have an inner side surface defining an internal space and an outer side surface adjacent to the stack ST. The vertical channel pattern VP may be provided to enclose the outer side surface of the vertical insulating pattern VI.

The vertical channel pattern VP may be formed of or include at least one of semiconductor materials (e.g., silicon (Si) and germanium (Ge)). The vertical channel pattern VP, which includes the semiconductor material, may be channel patterns of the upper transistors UT1 and UT2, the memory cell transistors MCT, and the lower transistors LT1 and LT2 described with reference to FIG. 1.

The data storage pattern DSP may be extended in the third direction D3 to enclose the outer side surface of the vertical channel pattern VP. The data storage pattern DSP may be a cylindrical structure in which a top portion is at least partially open. The data storage pattern DSP may be composed of one or more layers.

The source structure CST may be on the first upper insulating layer 310. The source structure CST may correspond to the source structure 3205 and/or 4205 of FIG. 3 or 4. In the cell array region CAR, the source structure CST may extend in the first and second directions D1 and D2.

The source structure CST may extend into the first upper insulating layer 310 through a first opening OP1, which is formed to extend through the first upper insulating layer 310 and the data storage pattern DSP and expose the vertical channel pattern VP.

The source structure CST may include a first semiconductor layer 301 and a second semiconductor layer 303. The first semiconductor layer 301 may be on and cover a top surface of the first upper insulating layer 310 and an inner side surface of the first upper insulating layer 310 exposed by the first opening OP1. The first semiconductor layer 301 may extend to a top surface of the vertical channel pattern VP. The second semiconductor layer 303 may be on the first semiconductor layer 301. The second semiconductor layer 303 may include a plate portion PLT, which is provided on the first upper insulating layer 310, and a via portion VIA, which extends into the first upper insulating layer 310 through the first opening OP1.

The plate portion PLT may extend in the first and second directions D1 and D2 and on the first upper insulating layer 310. In the first opening OP1, the via portion VIA may fill a space enclosed by the first semiconductor layer 301. The plate portion PLT and the via portion VIA may be a monolithic object. The source structure CST may be connected to the first vertical structures VS1.

Figure 7A:
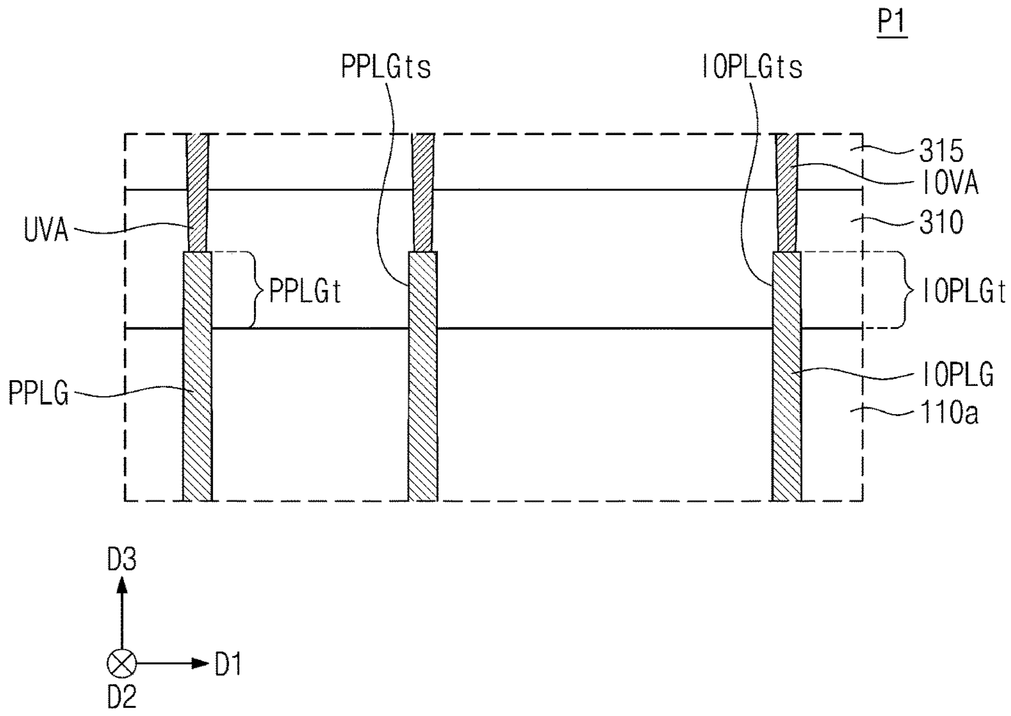
FIG. 7A is an enlarged sectional view illustrating a portion 'P1' of FIG. 6A.
Figure 7B:
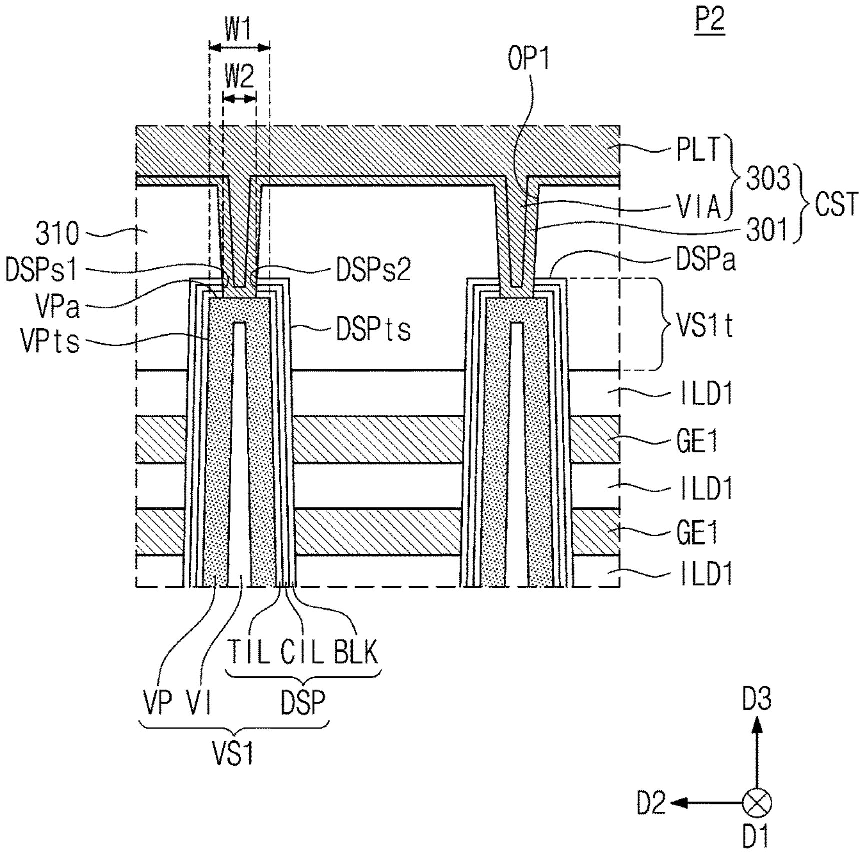
FIG. 7B is an enlarged sectional view illustrating a portion 'P2' of FIG. 6B.
Figure 7C:
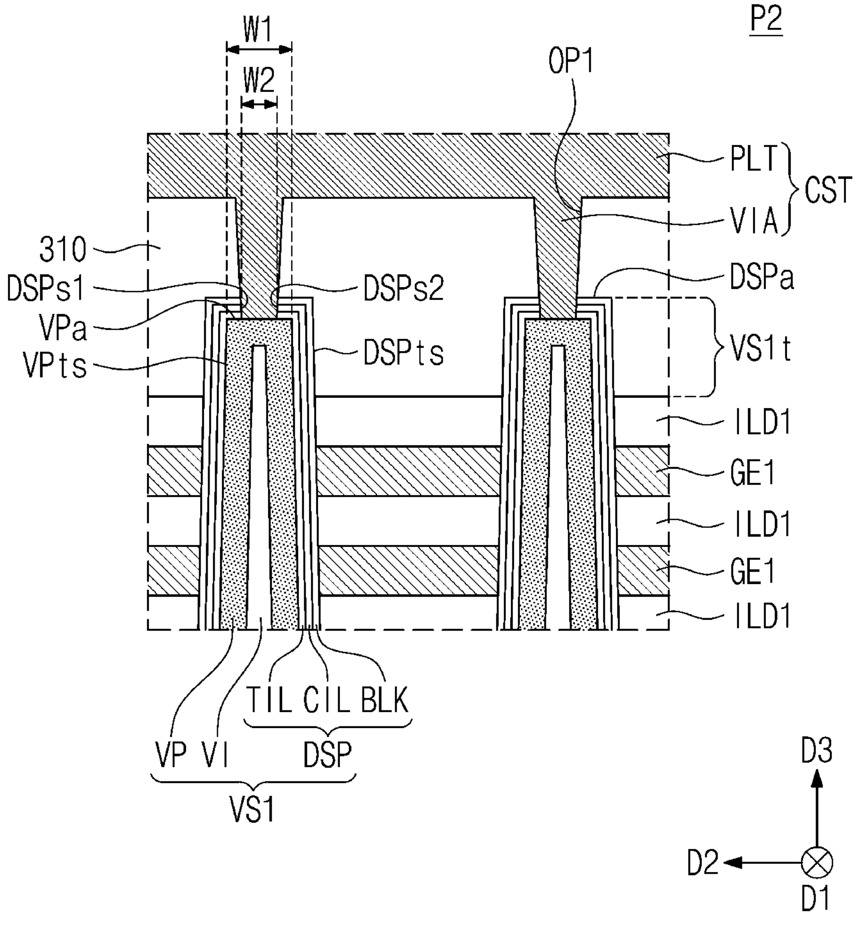
FIG. 7C is an enlarged sectional view illustrating the portion 'P2' of FIG. 6B.

However, there may be no observable interface between the first and second semiconductor layers 301 and 303, as shown in FIG. 7C. That is, the first and second semiconductor layers 301 and 303 may be provided to form a single/monolithic object.

The first and second semiconductor layers 301 and 303 may be formed of or include at least one of undoped and doped semiconductor materials or conductive materials.

Crystal particles of the first semiconductor layer 301 may have a grain size that is greater than or equal to crystal particles of the via portion VIA of the second semiconductor layer 303. Crystal particles of the plate portion PLT of the second semiconductor layer 303 may have a grain size that is greater than or equal to the crystal particles of the via portion VIA of the second semiconductor layer 303.

A second upper insulating layer 315 may be on and cover the source structure CST and the first upper insulating layer 310. Upper conductive patterns UCP and an input/output pad PAD may be on the second upper insulating layer 315. The input/output pad PAD may correspond to the input/output pad 1101 of FIG. 1 and/or the input/output pad 2210 of FIGS. 3 and 4.

A capping insulating layer 320, a protection layer 330, and a passivation layer 340 may be sequentially stacked on the second upper insulating layer 315. The capping insulating layer 320 may be, for example, a silicon nitride layer or a silicon oxynitride layer. The protection layer 330 may be, for example, a silicon nitride layer or a silicon oxynitride layer. The passivation layer 340 may be formed of or include at least one of polyimide-based materials (e.g., photo sensitive polyimide (PSPI)).

The capping insulating layer 320, the protection layer 330, and the passivation layer 340 may be provided to have a second opening OP2 exposing a portion of the input/output pad PAD.

A first insulating layer 120 may be below the second planarization insulating layer 110*b* and the stack ST. The first insulating layer 120 may be on and cover bottom surfaces of the first and second vertical structures VS1 and VS2.

First, second, and third separation structures SS1, SS2, and SS3 may be provided to extend through the first insulating layer 120, the planarization insulating layers 110*a* and 110*b*, and the stack ST. The first, second, and third separation structures SS1, SS2, and SS3 may correspond to the separation structures 3230 of FIG. 3 and/or the separation structures 4230 of FIG. 4.

Each of the first, second, and third separation structures SS1, SS2, and SS3 may include an insulating layer on and covering a side surface of the stack ST. Each of the first, second, and third separation structures SS1, SS2, and SS3 may have a single or multi-layered structure. In an embodiment, the first, second, and third separation structures SS1, SS2, and SS3 may be formed of or include at least one of insulating materials (e.g., silicon oxide, silicon oxynitride, and silicon nitride).

The first separation structures SS1 may extend from the cell array region CAR to the first connection region CNR1 in the first direction D1 and parallel to each other and may be spaced apart from each other in the second direction D2. In an embodiment, the stack ST may be between the first separation structures SS1, which are adjacent to each other in the second direction D2.

The second separation structure SS2 may be provided in the cell array region CAR and may extend through the stack ST. The second separation structure SS2 may be between the first separation structures SS1. When measured in the first direction D1, a length of the second separation structure SS2 may be less than a length of the first separation structure SS1. Alternatively, a plurality of second separation structures SS2 may be provided between the first separation structures SS1.

In the first connection region CNR1, the third separation structures SS3 may be spaced apart from the first and second separation structures SS1 and SS2 in the first direction D1 and may extend through the planarization insulating layers 110*a* and 110*b* and the stack ST. The third separation structures SS3 may extend in the first direction D1. The third separation structures SS3 may be spaced apart from each other in the first and second directions D1 and D2.

A second insulating layer 140 may be provided under the first insulating layer 120 to cover the first insulating layer 120 and first to third separation structures SS1, SS2, and SS3.

A bit line conductive pad may be at a bottom end of the first vertical structure VS1, and a lower bit line contact plug BCTa may extend through the first insulating layer 120 and contact the bit line conductive pad. The bit line conductive pad may be formed of at least one of undoped and doped semiconductor materials or conductive materials. Upper bit line contact plugs BCTb may extend through the second insulating layer 140 and contact the lower bit line contact plugs BCTa.

In the first connection region CNR1, the cell contact plugs CPLG may extend through the first and second insulating layers 120 and 140 and the planarization insulating layers 110*a* and 110*b* and may be respectively coupled to the pad portions of the first and second conductive patterns GE1 and GE2. The distance to the cell array region CAR decreases, the vertical lengths of the cell contact plugs CPLG decrease. The cell contact plugs CPLG may have bottom surfaces that are substantially coplanar with each other.

In the second connection region CNR2, the peripheral contact plugs PPLG and the input/output contact plugs IOPLG may extend through the first and second insulating layers 120 and 140 and the planarization insulating layers 110*a* and 110*b*. The input/output contact plugs IOPLG may correspond to the input/output connection line 1135 of FIG.

1, the input/output contact plug 3265 of FIG. 3, and/or the input/output contact plug 3265 of FIG. 4.

The peripheral contact plugs PPLG and the input/output contact plugs IOPLG may extend through the first upper insulating layer 310. Upper vias UVA may extend through the second upper insulating layer 315 and may extend through the first upper insulating layer 310. The peripheral contact plugs PPLG may be coupled to the upper conductive patterns UCP through the upper vias UVA. Input/output vias IOVA may extend through the second upper insulating layer 315 and through the first upper insulating layer 310. The input/output contact plugs IOPLG may be electrically connected to the input/output pads PAD through the input/output vias IOVA.

Each of the cell contact plugs CPLG, the peripheral contact plugs PPLG, and the input/output contact plug IOPLG may include a barrier pattern, which is formed of or includes at least one of conductive metal nitride materials (e.g., titanium nitride and tantalum nitride), and a metal pattern, which is formed of or includes at least one of metallic materials (e.g., tungsten, titanium, and tantalum).

The bit lines BL may be under the second insulating layer 140 and in the cell array region CAR. The bit lines BL may correspond to the bit lines BL in FIG. 1, the bit lines 3240 in FIG. 3, and/or the bit lines 4240 in FIG. 4.

The bit lines BL may extend in the second direction D2 to intersect the stack ST. The bit lines BL may be electrically connected to the first vertical structures VS1 through the lower and upper bit line contact plugs BCTa and BCTb.

First lower conductive lines LCLa may be under the second insulating layer 140 and in the first connection region CNR1 and may be coupled to the cell contact plugs CPLG.

Second lower conductive lines LCLb may be under the second insulating layer 140 and in the second connection region CNR2 and may be coupled to the peripheral and input/output contact plugs PPLG and IOPLG.

A third insulating layer 150 may be under the second insulating layer 140, and the bit lines BL and the first and second lower conductive lines LCLa and LCLb may be in the third insulating layer 150.

A fourth insulating layer 160 may be under the third insulating layer 150, and first and second upper conductive lines UCLa and UCLb may be in the fourth insulating layer 160. The first upper conductive lines UCLa may be electrically connected to the bit lines BL in the cell array region CAR. The second upper conductive lines UCLb may be electrically connected to the first and second lower conductive lines LCLa and LCLb in the first and second connection regions CNR1 and CNR2.

The first and second lower conductive lines LCLa and LCLb and the first and second upper conductive lines UCLa and UCLb may be formed of or include at least one of, for example, metallic materials (e.g., tungsten, copper, and aluminum), conductive metal nitride materials (e.g., titanium nitride and tantalum nitride), or transition metals (e.g., titanium and tantalum). For example, the first and second lower conductive lines LCLa and LCLb may be formed of or include a material (e.g., tungsten) having relatively high electric resistivity, and the first and second upper conductive lines UCLa and UCLb may be formed of or include a material (e.g., copper) having relatively low electric resistivity.

A fifth insulating layer 170 may be under the fourth insulating layer 160, and second bonding pads BP2 may be in the fifth insulating layer 170. The second bonding pads BP2 may be electrically connected to the first and second upper conductive lines UCLa and UCLb. The second bonding pads BP2 may be formed of or include aluminum, copper, or tungsten.

The second bonding pads BP2 may be electrically and physically connected to the first bonding pads BP1 by a bonding method. For example, the second bonding pads BP2 may be in direct contact with the first bonding pads BP1. In an embodiment, the first and second bonding pads BP1 and BP2 may be provided to form a single/monolithic object without an interface therebetween. The second bonding pads BP2 may be formed of or include the same metallic material as the first bonding pads BP1. The second bonding pads BP2 may be substantially the same as the first bonding pads BP1 in terms of shape, width, or area.

FIG. 7A is an enlarged sectional view illustrating a portion 'P1' of FIG. 6A. FIG. 7B is an enlarged sectional view illustrating a portion 'P2' of FIG. 6B.

Referring to FIG. 7A, each of the peripheral contact plugs PPLG may have a first protruding portion PPLGt, which extends through the first upper insulating layer 310. The first protruding portion PPLGt may be a portion of the peripheral contact plug PPLG extending through the first upper insulating layer 310. Each of the input/output contact plugs IOPLG may include a second protruding portion IOPLGt, which extends through the first upper insulating layer 310. The second protruding portion IOPLGt may be a portion of the input/output contact plug IOPLG extending through the first upper insulating layer 310. The first upper insulating layer 310 may be on and/or cover a side surface PPLGts of the first protruding portion PPLGt and a side surface IOPLGts of the second protruding portion IOPLGt.

Referring to FIG. 7B, the data storage pattern DSP may be a data storage layer of a NAND FLASH memory device and may include a tunneling insulating layer TIL, a charge storing layer CIL, and a blocking insulating layer BLK, which are sequentially stacked on a side surface of the vertical channel pattern VP. For example, the charge storing layer CIL may be a trap insulating layer, a floating gate electrode, or an insulating layer with conductive nanodots. In an embodiment, the Fowler-Nordheim (FN) tunneling phenomenon, which is caused by a voltage difference between the vertical channel pattern VP and the first and second conductive patterns GE1 and GE2, may be used to store or change data in the data storage pattern DSP. For example, the blocking insulating layer BLK and the tunneling insulating layer TIL may be formed of or include silicon oxide, and the charge storing layer CIL may be formed of or include silicon nitride or silicon oxynitride.

The data storage pattern DSP may include a first inner side surface DSPs1 and a second inner side surface DSPs2. The first and second inner side surfaces DSPs1 and DSPs2 may be surfaces of the data storage pattern DSP, which are located on the vertical channel pattern VP and are exposed by the first opening OP1. The first and second inner side surfaces DSPs1 and DSPs2 may be side surfaces that are opposite to each other in the first or second direction D1 or D2, when viewed in a sectional view.

A top surface VPa of the vertical channel pattern VP may have a first width W1. The first width W1 may be a diameter or distance of the top surface VPa of the vertical channel pattern VP in the first or second direction D1 or D2. The largest distance between the first and second inner side surfaces DSPs1 and DSPs2 may be a second width W2 in the first or second direction D1 or D2. The second width W2 may be less than or equal to the first width W1. A width of the via portion VIA of the second semiconductor layer 303 may be less than the first width W1. In other words, the width of the via portion VIA of the second semiconductor layer 303 may be less than a diameter or distance of the top surface VPa of the vertical channel pattern VP in the first or second direction D1 or D2.

The data storage pattern DSP may be on and/or cover at least a portion of the top surface VPa of the vertical channel pattern VP. A vertical level of a top surface DSPa of the data storage pattern DSP may be higher than a vertical level of the top surface VPa of the vertical channel pattern VP. Stated differently, a distance of the top surface DSPa of the data storage pattern DSP from the semiconductor substrate 200 is greater than a distance of the top surface VPa of the vertical channel pattern VP from the semiconductor substrate 200.

The first semiconductor layer 301 may be on and/or cover at least a portion of the first inner side surface DSPs1 and at least a portion of the second inner side surface DSPs2. The first semiconductor layer 301 may be on and/or cover at least a portion of the top surface VPa of the vertical channel pattern VP exposed by the first opening OP1. The via portion VIA of the second semiconductor layer 303 may fill a space of the first opening OP1 enclosed by the first semiconductor layer 301.

Each of the first vertical structures VS1 may include a third protruding portion VS1*t* that extends through the first upper insulating layer 310. The third protruding portion VS1*t* may be a portion of the first vertical structure VS1 that extends through the first upper insulating layer 310. In the third protruding portion VS1*t*, the vertical channel pattern VP may have a first outer side surface VPts, and the data storage pattern DSP may have a second outer side surface DSPts. The data storage pattern DSP may be on and/or cover the first outer side surface VPts. The first upper insulating layer 310 may be on and/or cover the top surface DSPa and the second outer side surface DSPts of the data storage pattern DSP. The first upper insulating layer 310 may be spaced apart from a vertical channel pattern VSP with the data storage pattern DSP interposed therebetween.

FIG. 7C is an enlarged sectional view illustrating the portion 'P2' of FIG. 6B. In the following description, an element previously described with reference to FIG. 7B may be identified by the same reference number without repeating an overlapping description thereof, for the sake of brevity.

Referring to FIG. 7C, the first and second semiconductor layers 301 and 303 of FIG. 7B may be merged such that the source structure CST is provided as a single/monolithic object. That is, the source structure CST of FIG. 7C may not have an interface that is found between the first and second semiconductor layers 301 and 303 of FIG. 7B. The source structure CST may include the via portion VIA and the plate portion PLT.

The via portion VIA of the source structure CST may extend through the first upper insulating layer 310 and the data storage pattern DSP and may be coupled to the vertical channel pattern VP. The plate portion PLT of the source structure CST may be on the first upper insulating layer 310 and the via portion VIA and may extend in the first and second directions D1 and D2.

The source structure CST may be formed of or include at least one of undoped and doped semiconductor materials or conductive materials.

Figure 8:
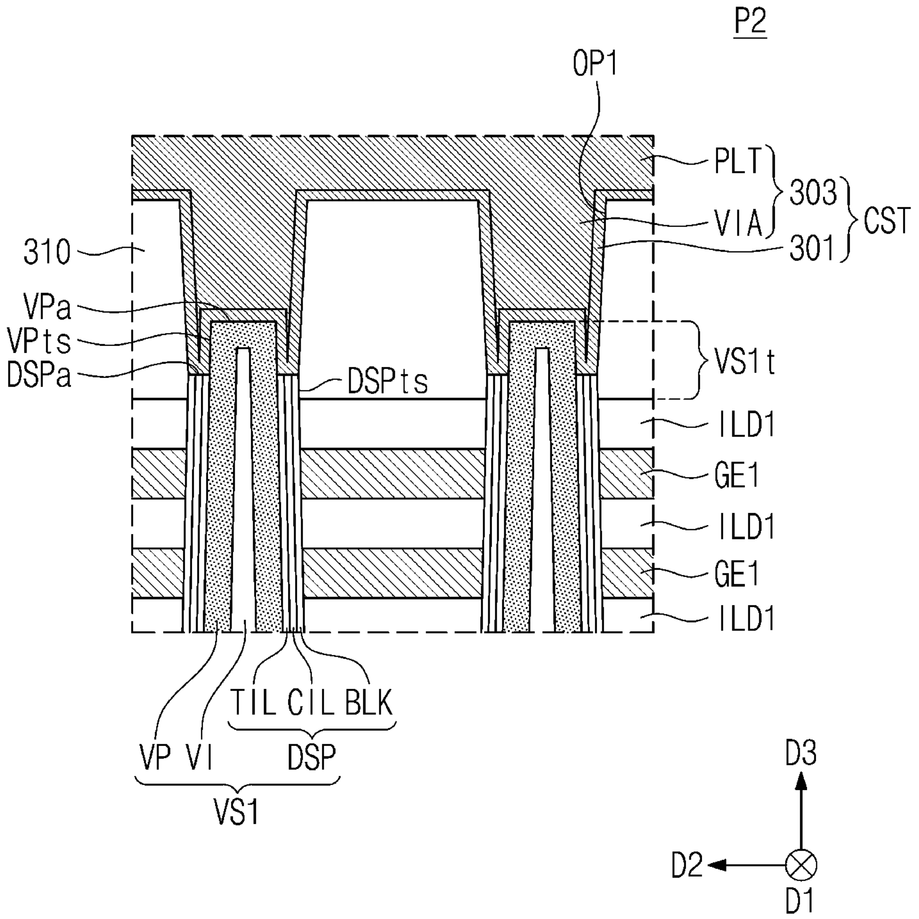
FIG. 8 is an enlarged sectional view illustrating the portion 'P2' of FIG. 6B.

FIG. 8 is an enlarged sectional view illustrating the portion 'P2' of FIG. 7B. In the following description, an element previously described with reference to FIG. 7B may be identified by the same reference number without repeating an overlapping description thereof, for the sake of brevity.

Referring to FIG. 8, the first opening OP1 may be formed to expose the entirety of the top surface VPa of the vertical channel pattern VP. The data storage pattern DSP may be on and/or cover a portion of the first outer side surface VPts of the vertical channel pattern VP and may not be extended to the top surface VPa of the vertical channel pattern VP. That is, a vertical level of the top surface DSPa of the data storage pattern DSP may be lower than a vertical level of the top surface VPa of the vertical channel pattern VP (i.e., a distance between the top surface DSPa and the semiconductor substrate 200 is less than a distance between the top surface VPa and the semiconductor substrate 200). A portion of the first outer side surface VPts of the vertical channel pattern VP may be exposed to the outside of the data storage pattern DSP. A vertical level of the top surface DSPa of the data storage pattern DSP may be higher than a vertical level of a top surface of the uppermost one of the first interlayer insulating layers ILD1 (i.e., a distance between the top surface DSPa and the semiconductor substrate 200 is greater than a distance between the top surface of the uppermost one of the first interlayer insulating layers ILD1 and the semiconductor substrate 200).

The first semiconductor layer 301 may be on and/or cover an inner side surface of the first upper insulating layer 310, the top surface DSPa of the data storage pattern DSP, at least a portion of the first outer side surface VPts of the vertical channel pattern VP, and the top surface VPa of the vertical channel pattern VP, which are exposed by the first opening OP1.

The first upper insulating layer 310 may be on and/or cover the second outer side surface DSPts of the data storage pattern DSP. The first upper insulating layer 310 may be spaced apart from the vertical channel pattern VP with the first and second semiconductor layers 301 and 303 interposed therebetween.

Figure 9A:
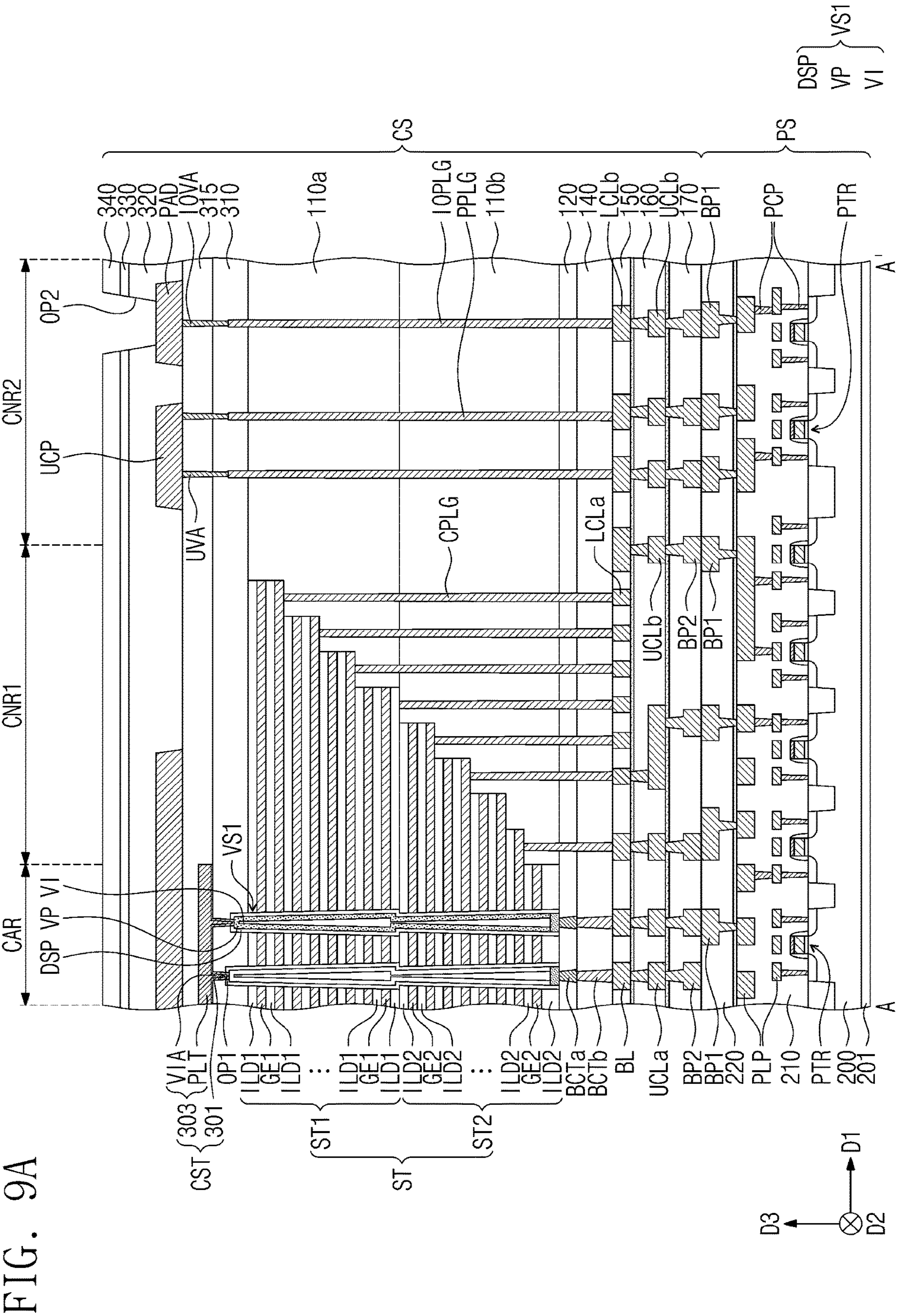
FIG. 9A is a sectional view that is taken along the line A-A' of FIG. 5 and illustrates a semiconductor device according to an embodiment of the present disclosure.
Figure 9B:
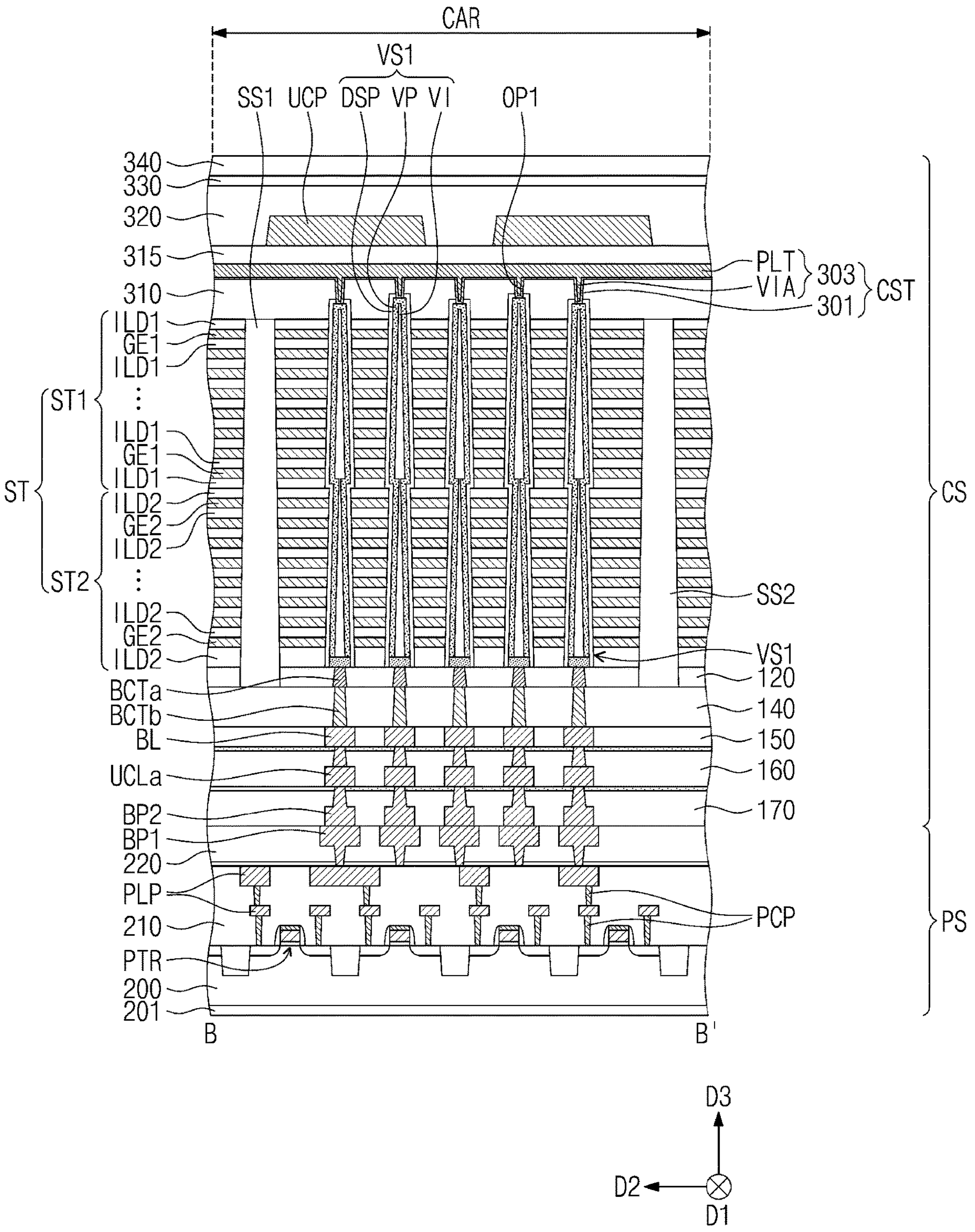
FIG. 9B is a sectional view that is taken along the line B-B' of FIG. 5 and illustrates a semiconductor device according to an embodiment of the present disclosure.

FIG. 9A is a sectional view, which is taken along the line A-A' of FIG. 5 to illustrate a semiconductor device according to an embodiment of the present disclosure. FIG. 9B is a sectional view, which is taken along the line B-B' of FIG. 5 to illustrate a semiconductor device according to an embodiment of the present disclosure. In the following description, an element previously described with reference to FIGS. 5, 6A, and 6B may be identified by the same reference number without repeating an overlapping description thereof, for the sake of brevity.

Referring to FIGS. 5, 9A, and 9B, lengths of the first vertical structures VS1, which extend through the first upper insulating layer 310, may be different from each other. That is, top surfaces of the first vertical structures VS1 may have different vertical levels from each other (i.e., a distance between the semiconductor substrate 200 and the top surfaces of the first vertical structures VS1 are different). In detail, the top surfaces DSPa (e.g., FIG. 7B) of the data storage patterns DSP of the first vertical structures VS1 may have different vertical levels from each other, and the top surfaces VPa (e.g., FIG. 7B) of the vertical channel patterns VP of the first vertical structures VS1 may have different vertical levels from each other. Accordingly, the via portions VIA, which extend through the first upper insulating layer 310, may have different vertical lengths from each other. That is, a vertical length of one of the via portions VIA of the second semiconductor layer 303 may be larger or smaller than a vertical length of another one of the via portions VIA of the second semiconductor layer 303.

Figure 10A:
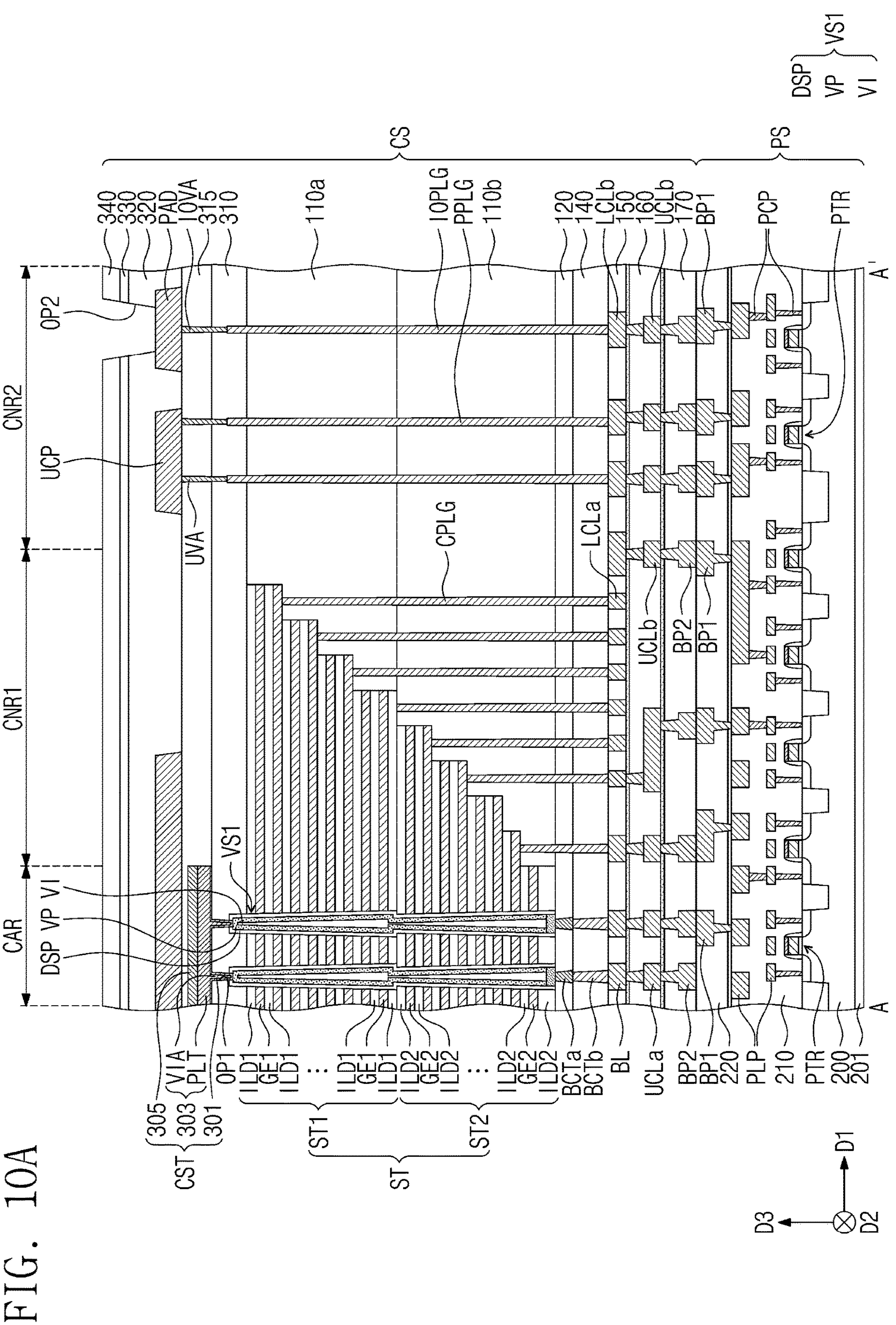
FIG. 10A is a sectional view that is taken along the line A-A' of FIG. 5 and illustrates a semiconductor device according to an embodiment of the present disclosure.
Figure 10B:
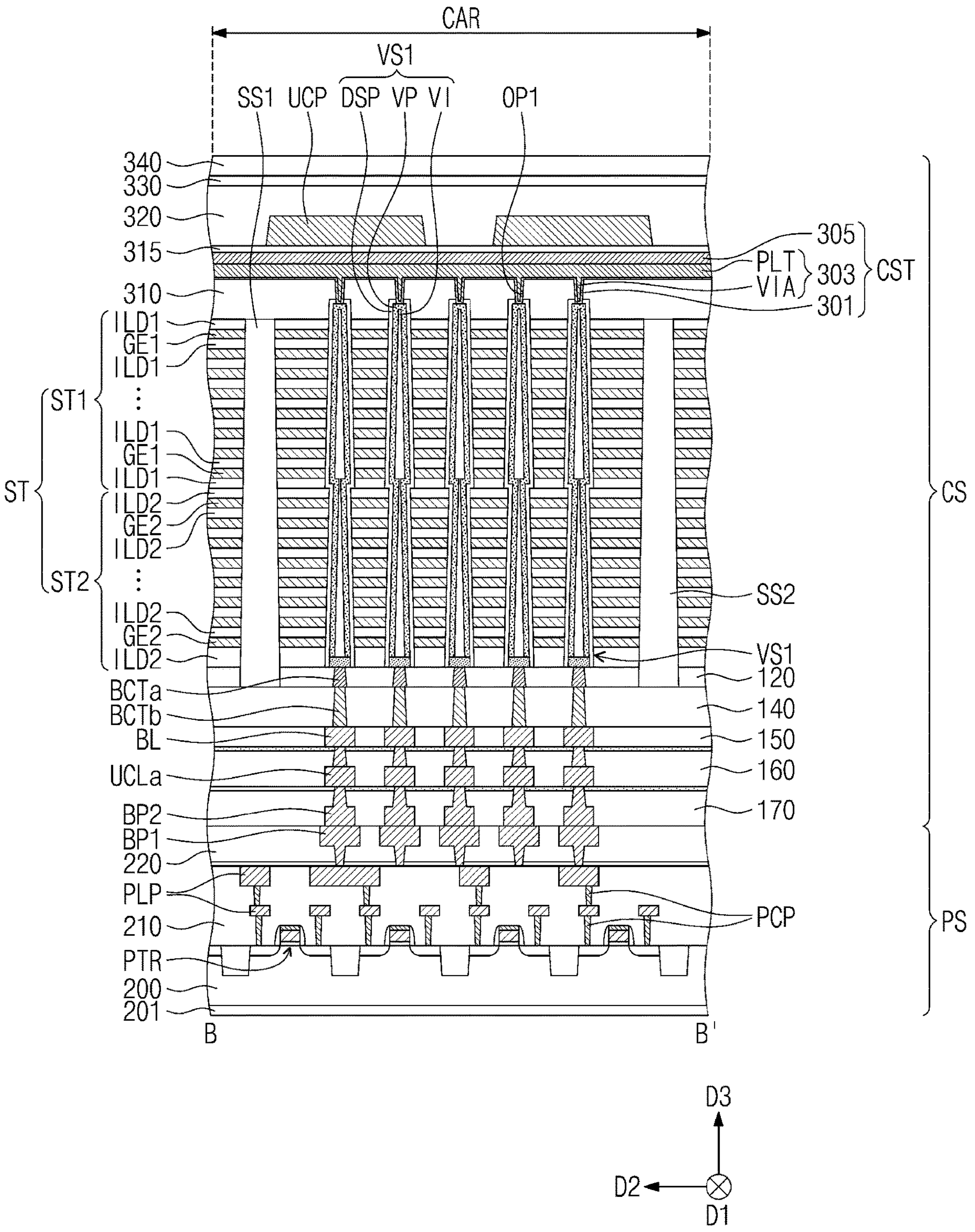
FIG. 10B is a sectional view that is taken along the line B-B' of FIG. 5 and illustrates a semiconductor device according to an embodiment of the present disclosure.

FIG. 10A is a sectional view, which is taken along line A-A' of FIG. 5 to illustrate a semiconductor device according to an embodiment of the present disclosure. FIG. 10B is a sectional view, which is taken along the line B-B' of FIG. 5 to illustrate a semiconductor device according to an embodiment of the present disclosure. In the following description, an element previously described with reference to FIGS. 5, 6A, and 6B may be identified by the same reference number without repeating an overlapping description thereof, for the sake of brevity.

Referring to FIGS. 5, 10A, and 10B, the source structure CST may further include a metal layer 305 on the second semiconductor layer 303. The metal layer 305 may be formed of or include at least one of, for example, metallic materials (e.g., tungsten, molybdenum, nickel, copper, and aluminum), conductive metal nitrides (e.g., titanium nitride and tantalum nitride), or transition metals (e.g., titanium and tantalum). As an example, the metal layer 305 may be formed of or include at least one metallic material (e.g., tungsten). A metal silicide layer may be interposed between the second semiconductor layer 303 and the metal layer 305.

FIGS. 11A, 12A, 13A, 14A, 15A, 16A, 17A, 18A, and 19A are sectional views, which are taken along the line A-A' of FIG. 5 to illustrate a method of fabricating a semiconductor device, according to an embodiment of the present disclosure. FIGS. 11B, 12B, 13B, 14B, 15B, 16B, 17B, 18B, and 19B are sectional views, which are taken along the line B-B' of FIG. 5 to illustrate a method of fabricating a semiconductor device, according to an embodiment of the present disclosure.

Figure 11A:
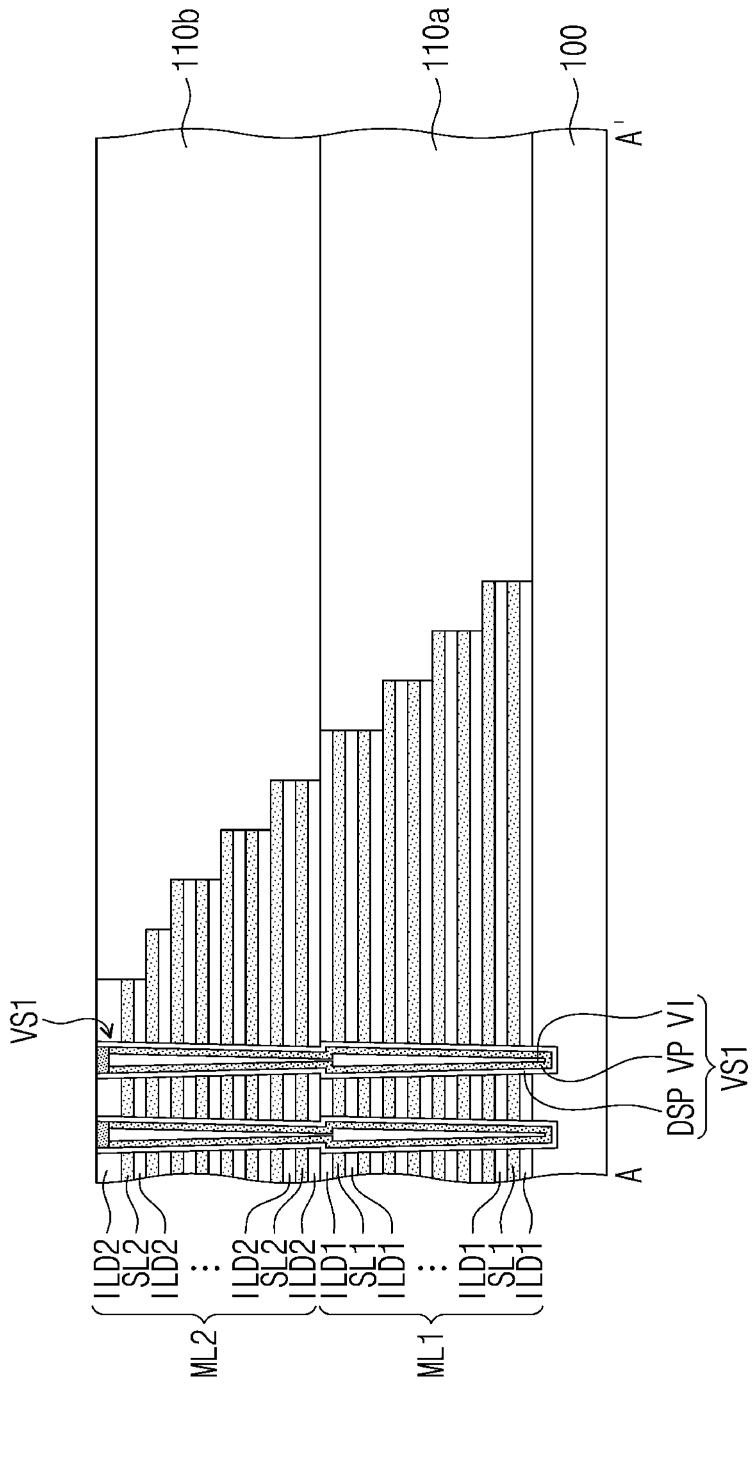
FIGS. 11A, 12A, 13A, 14A, 15A, 16A, 17A, 18A, and 19A are sectional views that are taken along the line A-A' of FIG. 5 and illustrate a method of fabricating a semiconductor device according to an embodiment of the present disclosure.
Figure 11B:
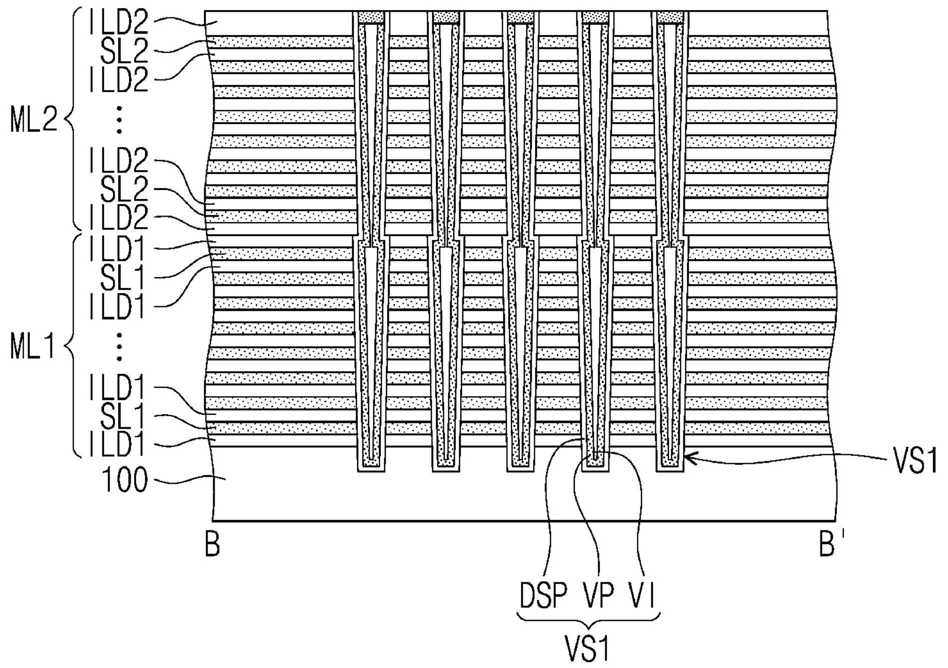
FIGS. 11B, 12B, 13B, 14B, 15B, 16B, 17B, 18B, and 19B are sectional views, which are taken along the line B-B' of FIG. 5 and illustrate a method of fabricating a semiconductor device according to an embodiment of the present disclosure.

Referring to FIGS. 5, 11A, and 11B, a first mold structure ML1 may be formed on a carrier substrate 100.

The formation of the first mold structure ML1 may include forming a first layered structure (not shown), in which the first interlayer insulating layers ILD1 and first sacrificial layers SL1 are vertically and alternately stacked, and repeatedly performing a patterning process on the first layered structure. Accordingly, the first mold structure ML1 may be formed to have a staircase structure in the first connection region CNR1.

The first interlayer insulating layers ILD1 and the first sacrificial layers SL1 may be deposited by a thermal chemical vapor deposition (thermal CVD) process, a plasma-enhanced chemical vapor deposition (PE-CVD) process, a physical chemical vapor deposition (physical CVD) process, or an atomic layer deposition (ALD) process.

The first sacrificial layers SL1 of the first mold structure ML1 may be formed of a material that can be etched with a high etch selectivity with respect to the first interlayer insulating layers ILD1. In an embodiment, the first sacrificial layers SL1 may be formed of or include an insulating material different from the first interlayer insulating layers ILD1. For example, the first sacrificial layers SL1 may be formed of or include silicon nitride, and the first interlayer insulating layers ILD1 may be formed of or include silicon oxide.

After the formation of the first mold structure ML1, the first planarization insulating layer 110*a* may be formed to cover the staircase structure of the first mold structure ML1.

Next, a second mold structure ML2 may be formed on the first mold structure ML1. In an embodiment, vertical sacrificial patterns (not shown) may be formed to extend through the first mold structure ML1 before the formation of the second mold structure ML2.

The formation of the second mold structure ML2 may be substantially the same as the formation of the first mold structure ML1 described above. For example, the formation of the second mold structure ML2 may include forming a second layered structure (not shown), in which second interlayer insulating layers ILD2 and second sacrificial layers SL2 are vertically and alternately stacked, on the first mold structure ML1, and repeatedly performing a patterning process on the second layered structure. Accordingly, the second mold structure ML2 may be formed to have a staircase structure in the first connection region CNR1.

The second sacrificial layers SL2 may be formed of or include the same material as the first sacrificial layers SL1 and may have substantially the same thickness as the first sacrificial layers SL1. The second sacrificial layers SL2 may be formed of or include an insulating material that is different from the second interlayer insulating layers ILD2. The second sacrificial layers SL2 may be formed of or include the same material as the first sacrificial layers SL1. For example, the second sacrificial layers SL2 may be formed of or include silicon nitride, and the second interlayer insulating layers ILD2 may be formed of or include silicon oxide.

After the formation of the second mold structure ML2, the second planarization insulating layer 110*b* may be formed to cover the staircase structure of the second mold structure ML2.

Vertical channel holes may be formed to extend through the first and second mold structures ML1 and ML2 and to expose the carrier substrate 100. In the case where the vertical sacrificial patterns (not shown) are formed in the first mold structure ML1, the formation of the vertical channel holes may include removing the vertical sacrificial patterns to expose the carrier substrate 100.

When the vertical channel holes are formed, dummy channel holes may be formed in the first connection region CNR1 to extend through the planarization insulating layers 110*a* and 110*b* and at least a portion of the first and second mold structures ML1 and ML2.

The formation of the vertical channel holes may include forming a hard mask pattern on the second mold structure ML2 and anisotropically etching the first and second mold structures ML1 and ML2 using the hard mask pattern as an etch mask. The anisotropic etching process of forming the vertical channel holes may be performed in an over-etching manner, and in this case, a top surface of the carrier substrate 100 exposed by the vertical channel holes may be recessed to specific depths. Furthermore, the recess depths of the carrier substrate 100 may vary depending on positions of the vertical channel holes in the anisotropic etching process of forming the vertical channel holes.

Next, the first vertical structures VS1 may be formed in the vertical channel holes of the cell array region CAR, and the second vertical structures VS2 may be formed in the dummy channel holes of the first connection region CNR1.

The formation of the first and second vertical structures VS1 and VS2 may include sequentially depositing a data storage layer (not shown) and a vertical channel layer (not shown) in the vertical channel holes and etching and planarizing the data storage layer and the vertical channel layer.

The data storage layer may be conformally deposited on bottom and side surfaces of the vertical channel holes by a chemical vapor deposition (CVD) method or an atomic layer deposition (ALD) method. The data storage layer may include the blocking insulating layer BLK, the charge storing layer CIL, and the tunneling insulating layer TIL, which are sequentially stacked in the vertical channel holes, as shown in FIG. 7B. The vertical channel layer may be conformally deposited on the data storage layer by a chemical vapor deposition (CVD) method or an atomic layer deposition (ALD) method. After the formation of the data storage layer and the vertical channel layer, the vertical channel holes may be filled with a gapfill insulating layer (not shown). Accordingly, the data storage pattern DSP, the vertical channel pattern VP, and the vertical insulating pattern VI may be formed in each vertical channel hole, as described above.

Next, the bit line conductive pads may be formed in top portions of the vertical channel patterns VP. The bit line conductive pads may be an impurity-doped region or may be formed of or include at least one of conductive materials. Top surfaces of the bit line conductive pads may be coplanar with a top surface of the uppermost second upper insulating layer ILD2.

Figure 12A:
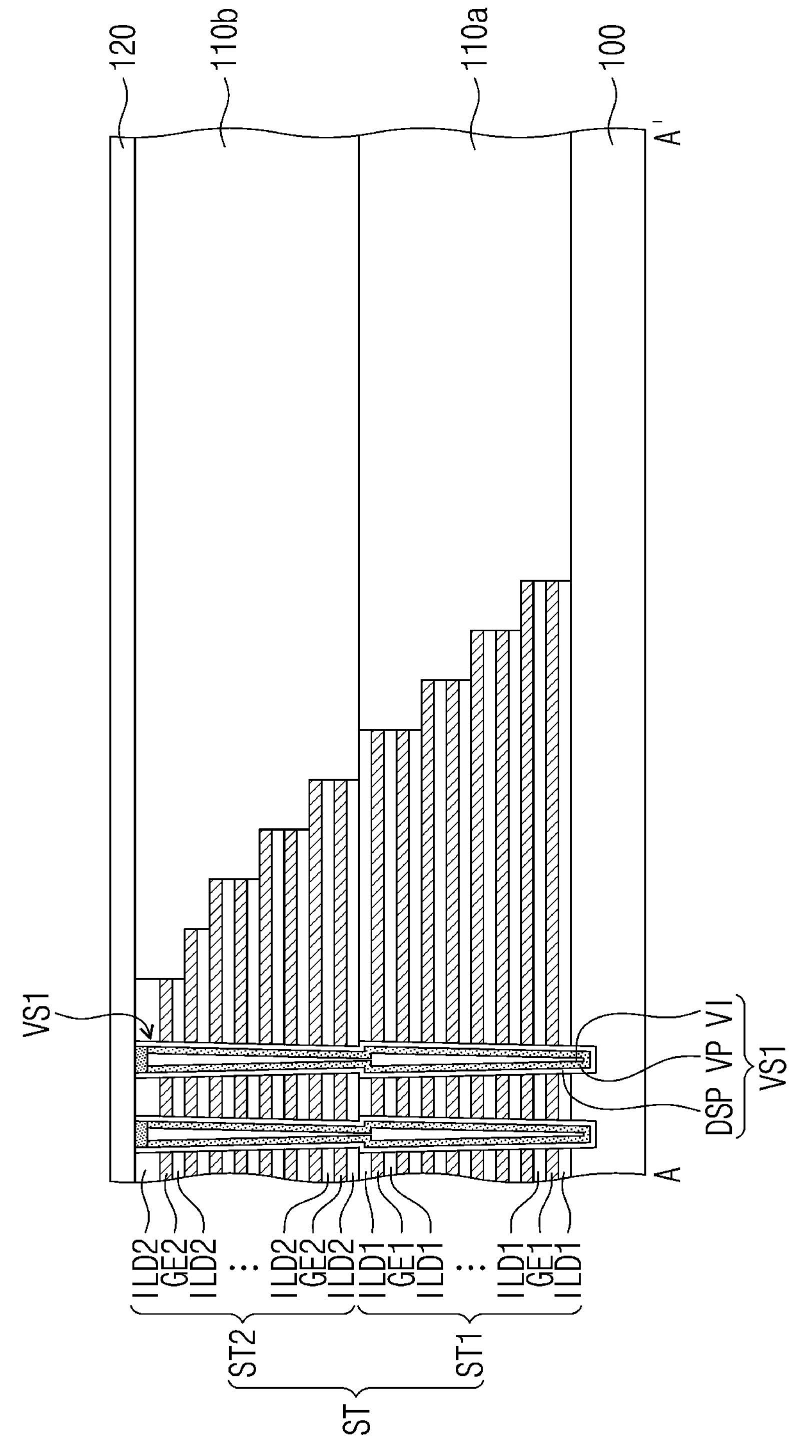
Figure 12B:
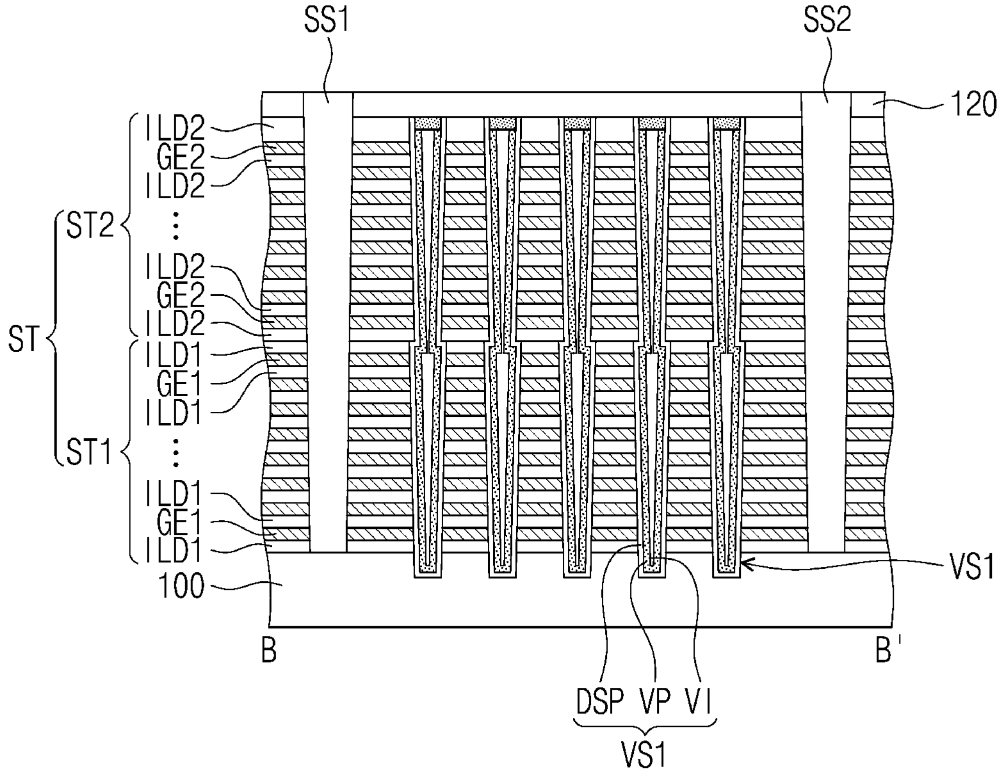

Referring to FIGS. 5, 12A, and 12B, the first insulating layer 120 may be formed on the second planarization insulating layer 110*b* to cover top surfaces of the first and second vertical structures VS1 and VS2.

Next, a process may be performed to replace the first and second sacrificial layers SL1 and SL2 of the first and second mold structures ML1 and ML2 with the first and second conductive patterns GE1 and GE2. Accordingly, the stack ST may be formed on the carrier substrate 100.

The replacement of the first and second sacrificial layers SL1 and SL2 may include isotropically etching the first and second sacrificial layers SL1 and SL2 using an etch recipe, which is chosen to have an etch selectivity with respect to the first and second interlayer insulating layers ILD1 and ILD2, the first and second vertical structures VS1 and VS2, and the carrier substrate 100. In detail, the replacement of the first and second sacrificial layers SL1 and SL2 may include forming first, second, and third trenches (not shown) that extend through the first insulating layer 120 and the stack ST, isotropically etching the first and second sacrificial layers SL1 and SL2 exposed by the first, second, and third trenches to form gap regions, and forming the first and second conductive patterns GE1 and GE2 in the gap regions. Next, the first, second, and third separation structures SS1, SS2, and SS3 may be formed to fill the first, second, and third trenches. Top surfaces of the first, second, and third separation structures SS1, SS2, and SS3 may be coplanar with a top surface of the first insulating layer 120.

Figure 13A:
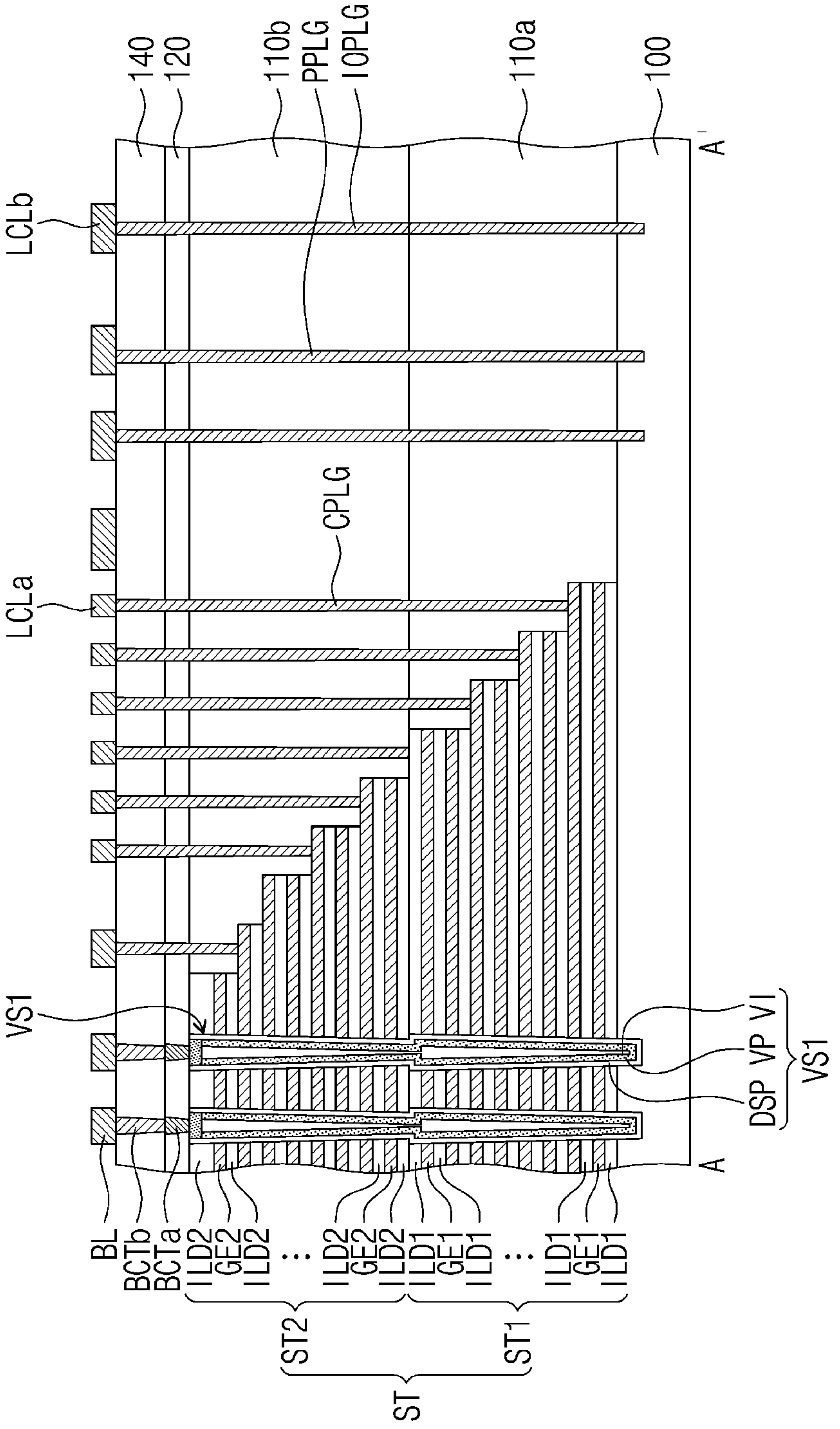
Figure 13B:
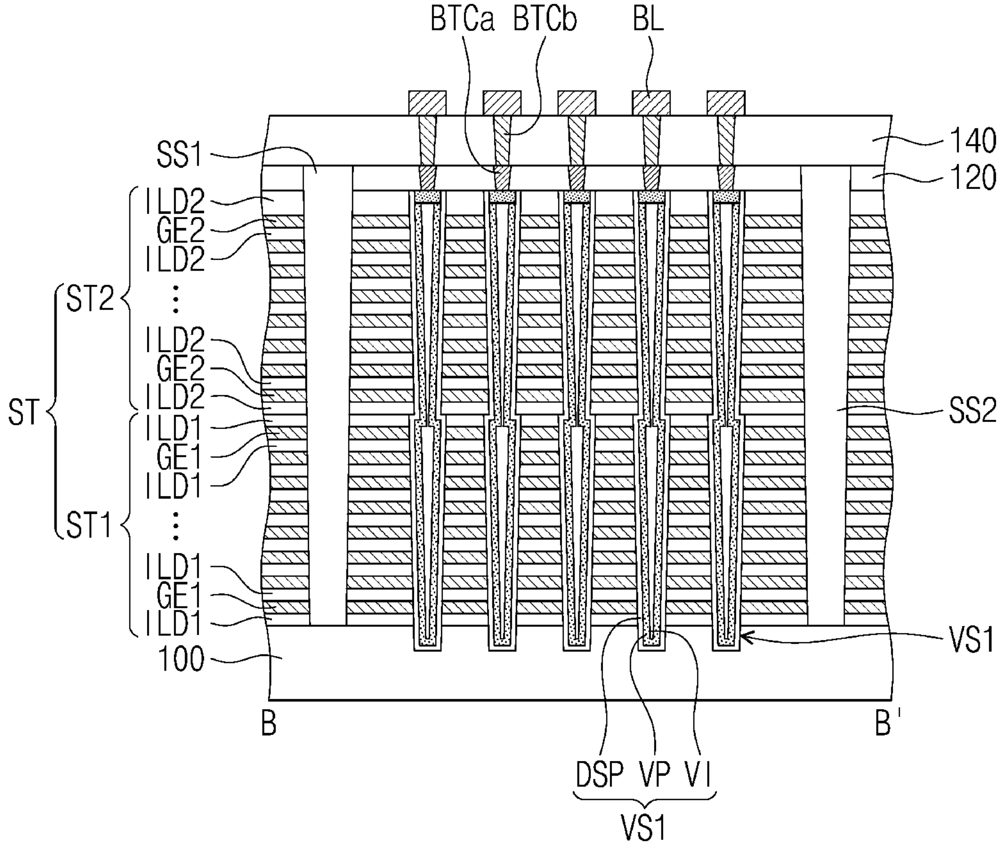

Referring to FIGS. 5, 13A, and 13B, the lower bit line contact plugs BCTa may be formed to extend through the first insulating layer 120 and to be coupled to the first vertical structures VS1. The lower bit line contact plugs BCTa may be in contact with the bit line conductive pads of the first vertical structures VS1. The bit line conductive pad may be formed of or include at least one of undoped and doped semiconductor materials or conductive materials.

Next, the second insulating layer 140 may be formed on the first insulating layer 120. The upper bit line contact plugs BCTb may be formed to extend through the second insulating layer 140 and to be connected to the lower bit line contact plugs BCTa. The cell contact plugs CPLG may be formed to extend through the second insulating layer 140, the first insulating layer 120, and the planarization insulating layers 110*a* and 110*b* and to be respectively connected to the conductive patterns GE1 and GE2. The peripheral and input/output contact plugs PPLG and IOPLG may be formed to extend through the second insulating layer 140, the first insulating layer 120, the planarization insulating layers 110*a* and 110*b*, and the carrier substrate 100.

The formation of the cell contact plug CPLG may include forming a contact hole in the first connection region CNR1 to extend through the second insulating layer 140, the first insulating layer 120, and the planarization insulating layers 110*a* and 110*b* and expose one of the conductive patterns GE1 and GE2 and filling the contact hole with a conductive material.

The formation of the peripheral and input/output contact plugs PPLG and IOPLG may include forming contact holes in the second connection region CNR2 to extend through the second insulating layer 140, the first insulating layer 120, and the planarization insulating layers 110*a* and 110*b* and expose the carrier substrate 100 and filling the contact holes with a conductive material.

The bit lines BL may be formed on the second insulating layer 140. The bit lines BL may be connected to the upper bit line contact plugs BCTb.

The first lower conductive lines LCLa, which are connected to the cell contact plugs CPLG, may be formed in the first connection region CNR1. The second lower conductive lines LCLb, which are connected to the peripheral and input/output contact plugs PPLG and IOPLG, may be formed in the second connection region CNR2.

Figure 14A:
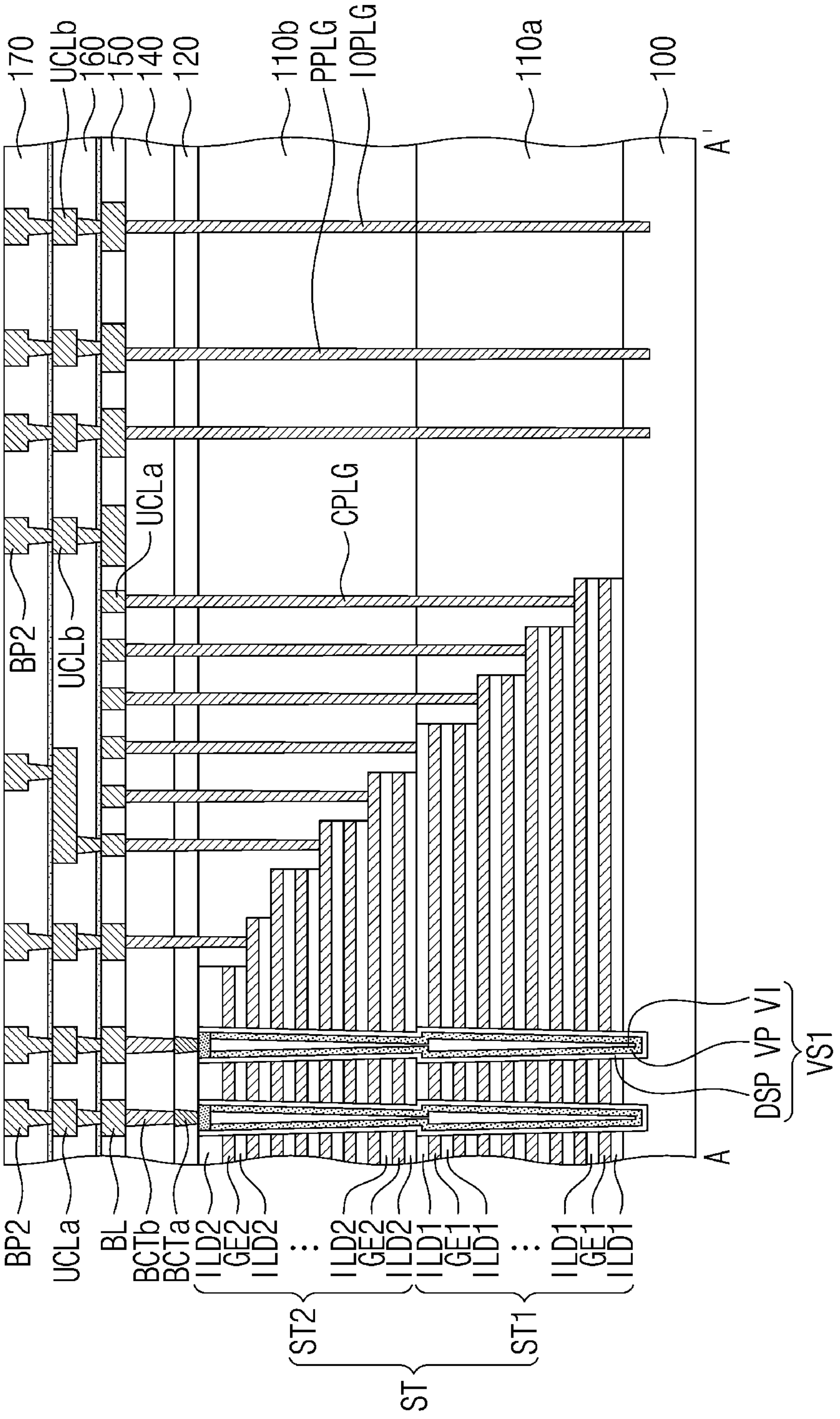
Figure 14B:
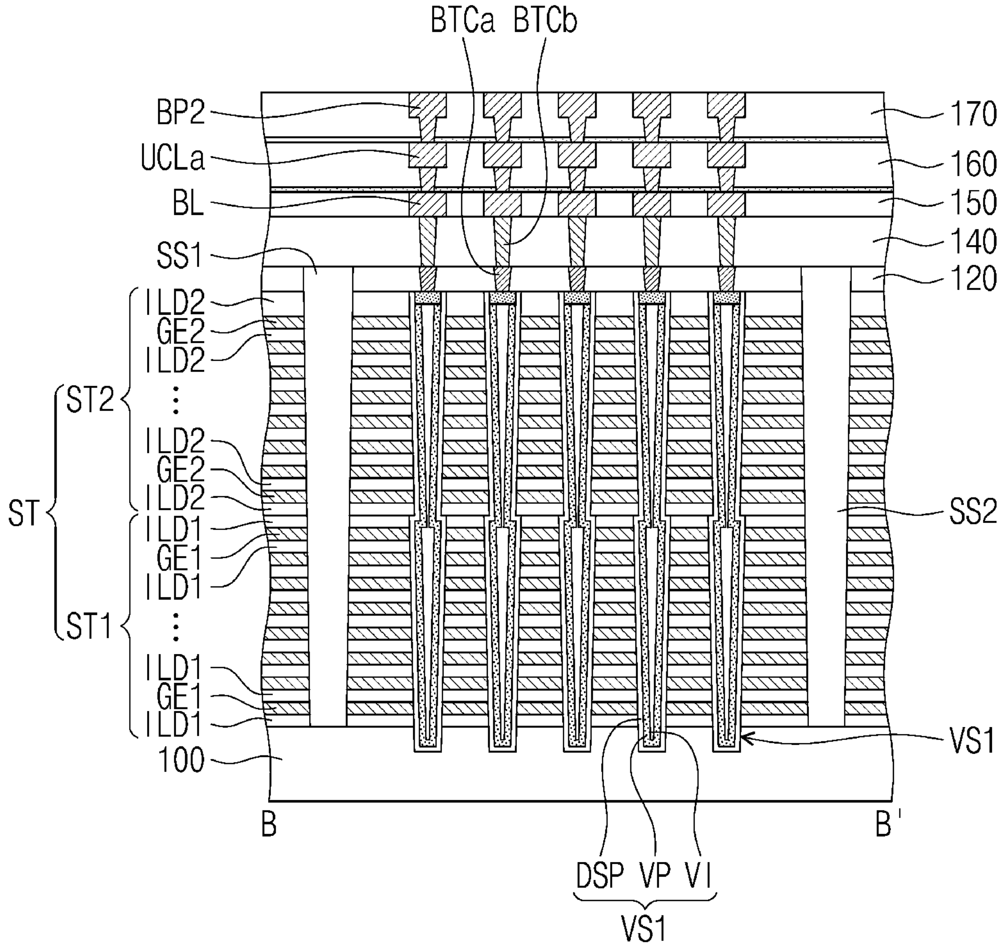

Referring to FIGS. 5, 14A, and 14B, the third, fourth, and fifth insulating layers 150, 160, and 170 may be stacked on the second insulating layer 140, and the first upper conductive lines UCLa may be formed on the third insulating layer 150 in the cell array region CAR. The first upper conductive lines UCLa may be connected to the bit lines BL. During this process, the second upper conductive lines UCLb may be formed on the third insulating layer 150 in the first and second connection regions CNR1 and CNR2 and may be connected to the first and second lower conductive lines LCLa and LCLb. The first and second upper conductive lines UCLa and UCLb may be formed in the fourth insulating layer 160.

The second bonding pads BP2 may be formed in the fifth insulating layer 170, and the second bonding pads BP2 may be connected to the first and second upper conductive lines UCLa and UCLb.

The first and second upper conductive lines UCLa and UCLb and the second bonding pads BP2 may be formed using a damascene process. The second bonding pads BP2 may have top surfaces that are substantially coplanar with a top surface of the fifth insulating layer 170.

Figure 15A:
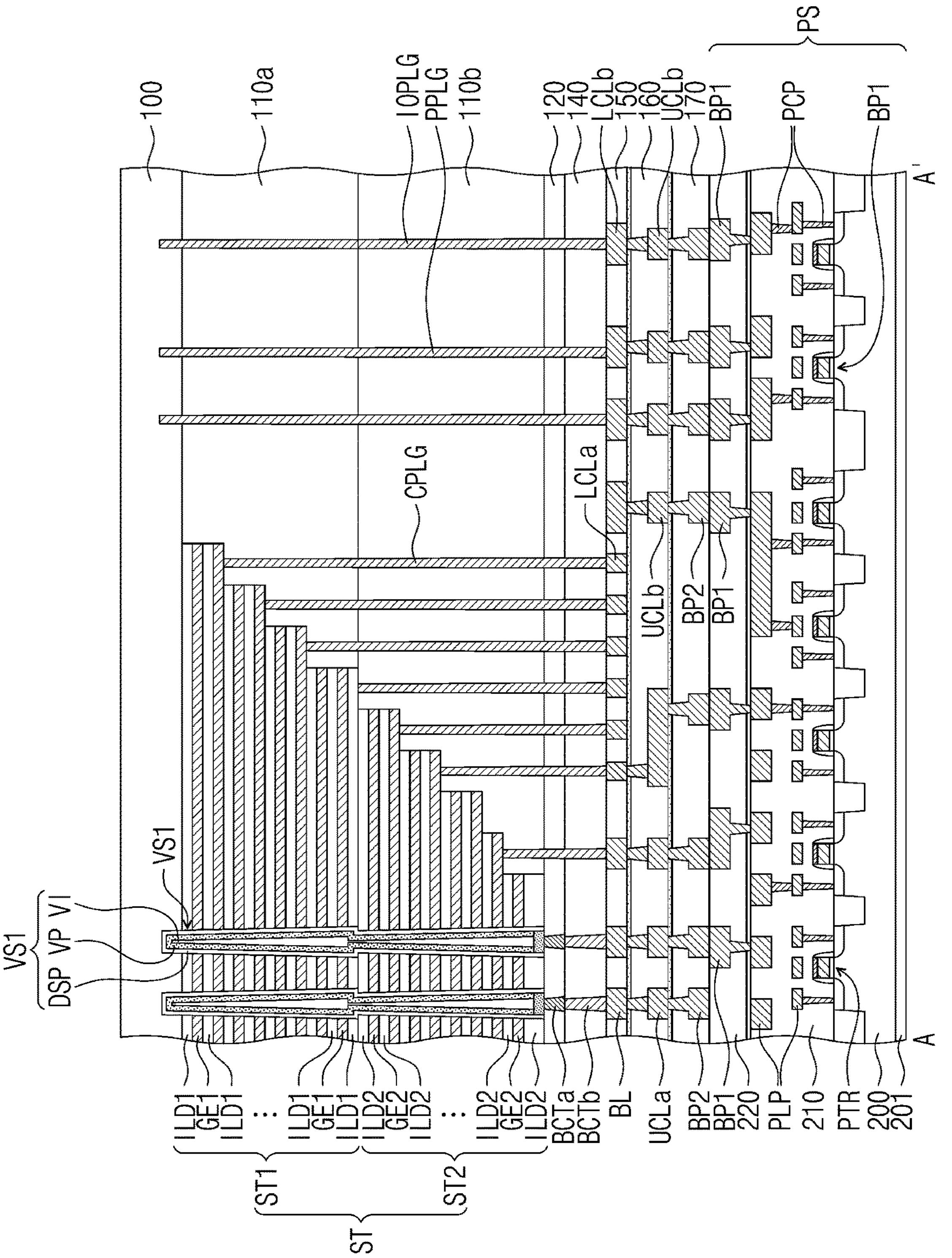
Figure 15B:
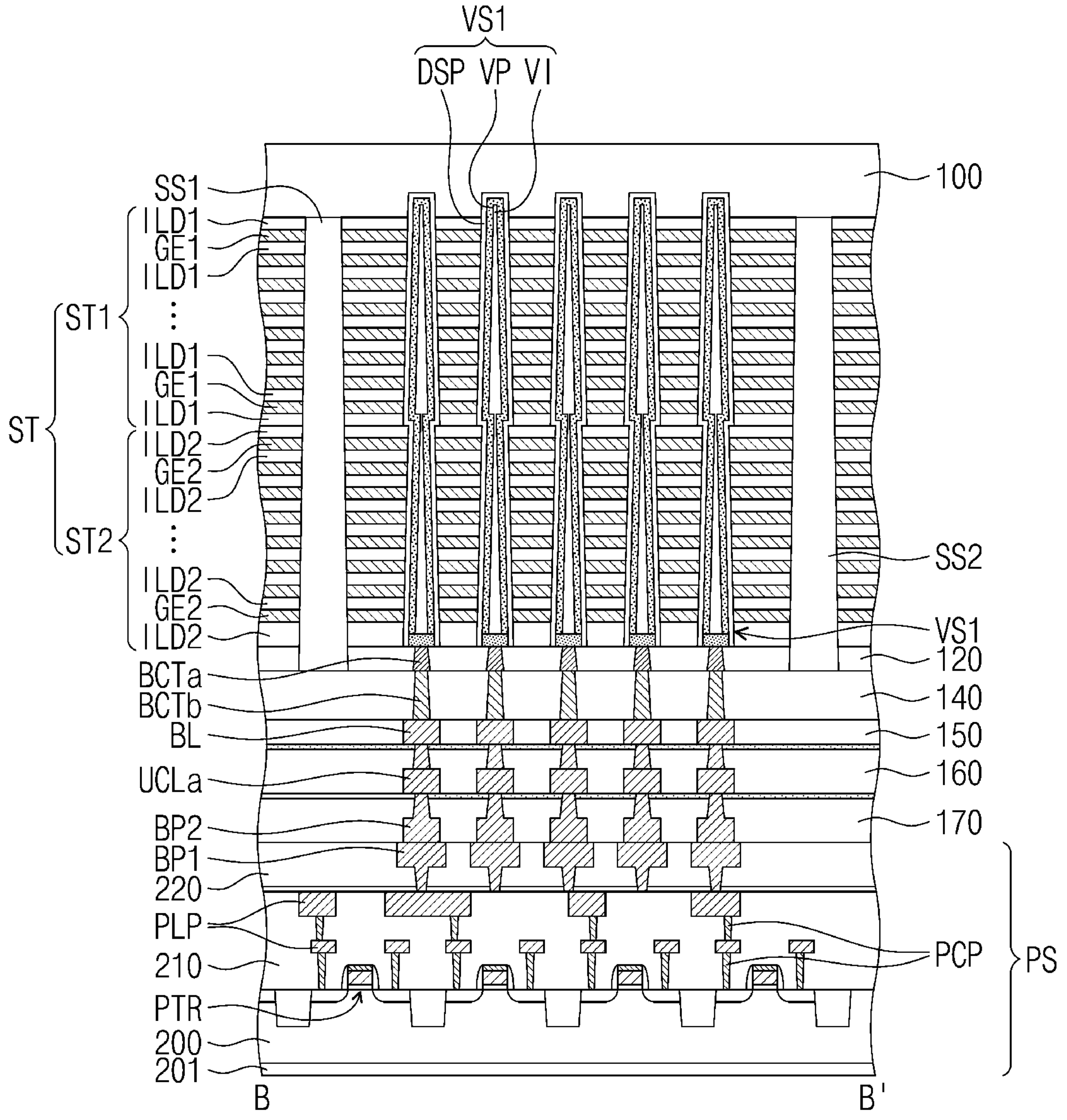

Referring to FIGS. 5, 15A, and 15B, the peripheral circuit structure PS, which includes the peripheral circuits PTR formed on the semiconductor substrate 200, may be prepared.

In detail, the formation of the peripheral circuit structure PS may include forming a device isolation layer to define an active region in the semiconductor substrate 200, forming the peripheral circuits PTR on the active region of the semiconductor substrate 200, and forming the peripheral plugs PCP, the peripheral circuit lines PLP, and the first bonding pads BP1.

The semiconductor substrate 200 may be formed of or include at least one of silicon (Si), germanium (Ge), silicon germanium (SiGe), gallium arsenic (GaAs), indium gallium arsenic (InGaAs), or aluminum gallium arsenic (AlGaAs).

Row and column decoders, page buffers, and control circuits, which correspond to the peripheral circuits PTR, may be formed on the semiconductor substrate 200. In an embodiment, the peripheral circuits PTR may include MOS transistors, and here, the semiconductor substrate 200 may correspond to channel regions of the MOS transistors.

The peripheral circuit insulating layers 210 and 220 may include a single insulating layer or a plurality of vertically-stacked insulating layers covering the peripheral circuits PTR. In an embodiment, the peripheral circuit insulating layers 210 and 220 may include a plurality of lower insulating layers and etch stop layers between the lower insulating layers. Each of the peripheral circuit insulating layers 210 and 220 may include, for example, a silicon oxide layer, a silicon nitride layer, a silicon oxynitride layer, and/or a low-k dielectric layer.

The peripheral plugs PCP may be formed to extend through portions of the peripheral circuit insulating layers 210 and 220 and to be connected to the peripheral circuits PTR. The peripheral circuit lines PLP may be formed by depositing and patterning a conductive layer.

The first bonding pads BP1 may be formed in the uppermost peripheral circuit insulating layer 220 of the peripheral circuit insulating layers 210 and 220. The first bonding pads BP1 may be electrically connected to the peripheral circuits PTR through the peripheral plugs PCP and the peripheral circuit lines PLP.

The first bonding pads BP1 may be formed using a damascene process. The first bonding pads BP1 may be formed to have top surfaces that are substantially coplanar with a top surface of the uppermost peripheral circuit insulating layer 220. In an embodiment, a planarization process may be performed to form the substantially coplanar surfaces. For example, the planarization process may be performed using a chemical mechanical polishing (CMP) process or an etch-back process.

Next, the cell array structure CS, which is formed on the carrier substrate 100, may be bonded to the peripheral circuit structure PS, which is formed on the semiconductor substrate 200. Accordingly, the first bonding pads BP1 of the peripheral circuit structure PS and the second bonding pads BP2 of the cell array structure CS may be bonded to each other, and the fifth insulating layer 170 on the carrier substrate 100 may be bonded to the uppermost peripheral circuit insulating layer 220 on the semiconductor substrate 200.

Since the first and second bonding pads BP1 and BP2 are bonded to each other, it may be possible to invert the cell array structure CS. That is, the carrier substrate 100 of the cell array structure CS may be placed at the uppermost level, and the staircase structure of the stack ST may have an inverted shape.

Figure 16A:
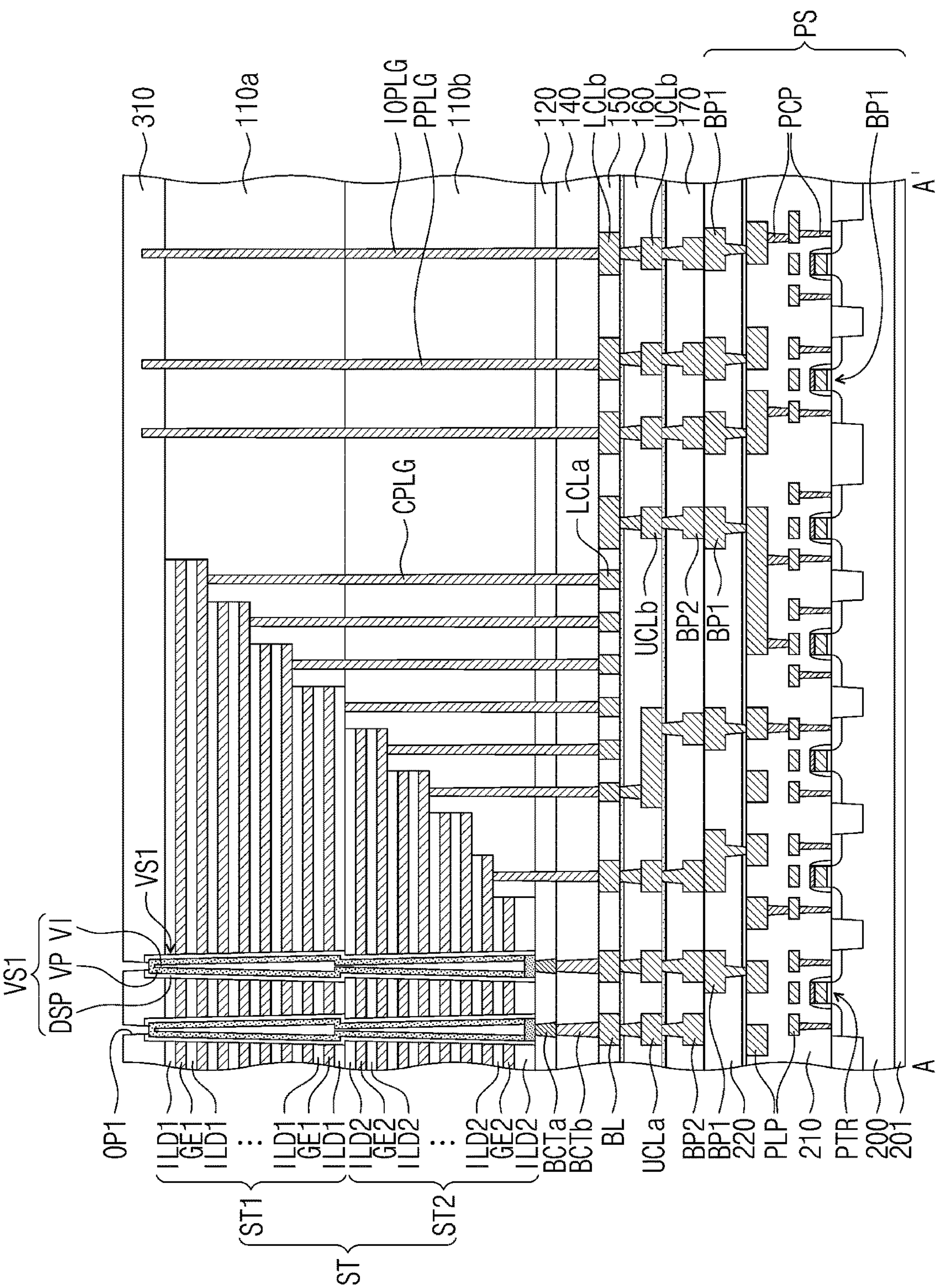
Figure 16B:
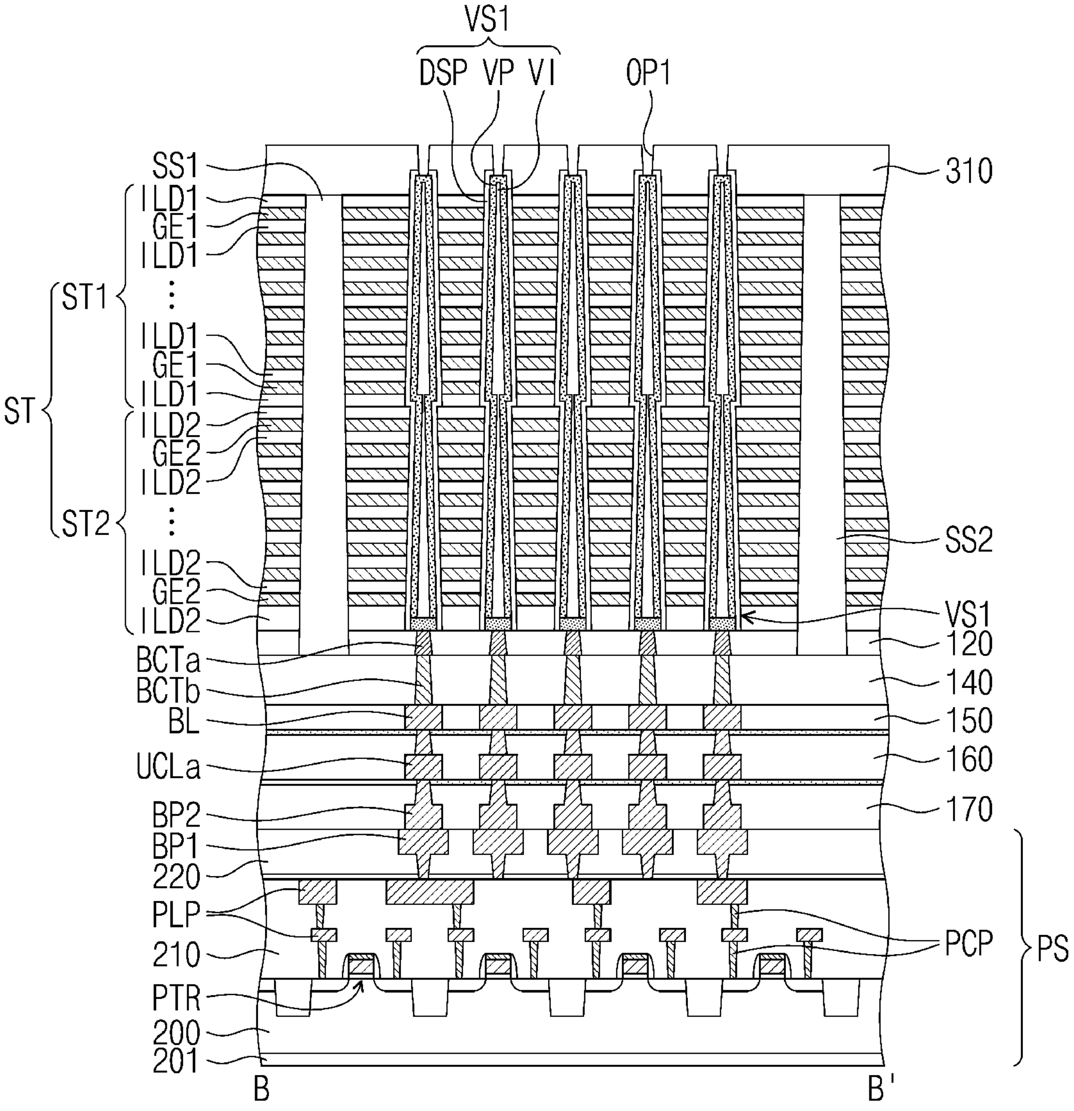

Referring to FIGS. 5, 16A, and 16B, the carrier substrate 100 may be removed, after the bonding of the first and second bonding pads BP1 and BP2. The removal of the carrier substrate 100 may include a grinding process, a planarization process, a dry etching process, and a wet etching process. As a result of the removal of the carrier substrate 100, the top surface of the interlayer insulating layer ILD1 of the stack ST and the top surface of the first planarization insulating layer 110*a* may be exposed.

In addition, as a result of the removal of the carrier substrate 100, upper portions of the peripheral contact plugs PPLG and an upper portion of the input/output contact plug IOPLG may be an outwardly protruding portion, which is exposed to the outside of the uppermost interlayer insulating layer ILD1. Each of the exposed portions of the peripheral and input/output contact plugs PPLG and IOPLG may correspond to the first or second protruding portion PPLGt or IOPLGt of FIG. 7B. Furthermore, an upper portion of each of the first vertical structures VS1 may be an outwardly protruding portion, which is exposed to the outside of the uppermost interlayer insulating layer ILD1. The exposed portion of the first vertical structures VS1 may correspond to the third protruding portion VS1*t* of FIG. 7B.

The first upper insulating layer 310 may be formed to cover the top surface of the interlayer insulating layer ILD1 of the stack ST and the top surface of the first planarization insulating layer 110*a*. The first upper insulating layer 310 may cover the protruding upper portions of the peripheral contact plugs PPLG, the input/output contact plug IOPLG, and the first vertical structures VS1. The first upper insulating layer 310 may be formed using a deposition method (e.g., a chemical vapor deposition (CVD) method or an atomic layer deposition (ALD) method).

An anisotropic etching process may be performed on the first upper insulating layer 310 to form the first openings OP1 exposing the vertical channel pattern VP of the first vertical structures VS1, respectively. The formation of the first openings OP1 may include forming a hard mask pattern on the first upper insulating layer 310 and anisotropically etching the first upper insulating layer 310 and the data storage pattern DSP using the hard mask pattern as an etch mask.

Figure 17A:
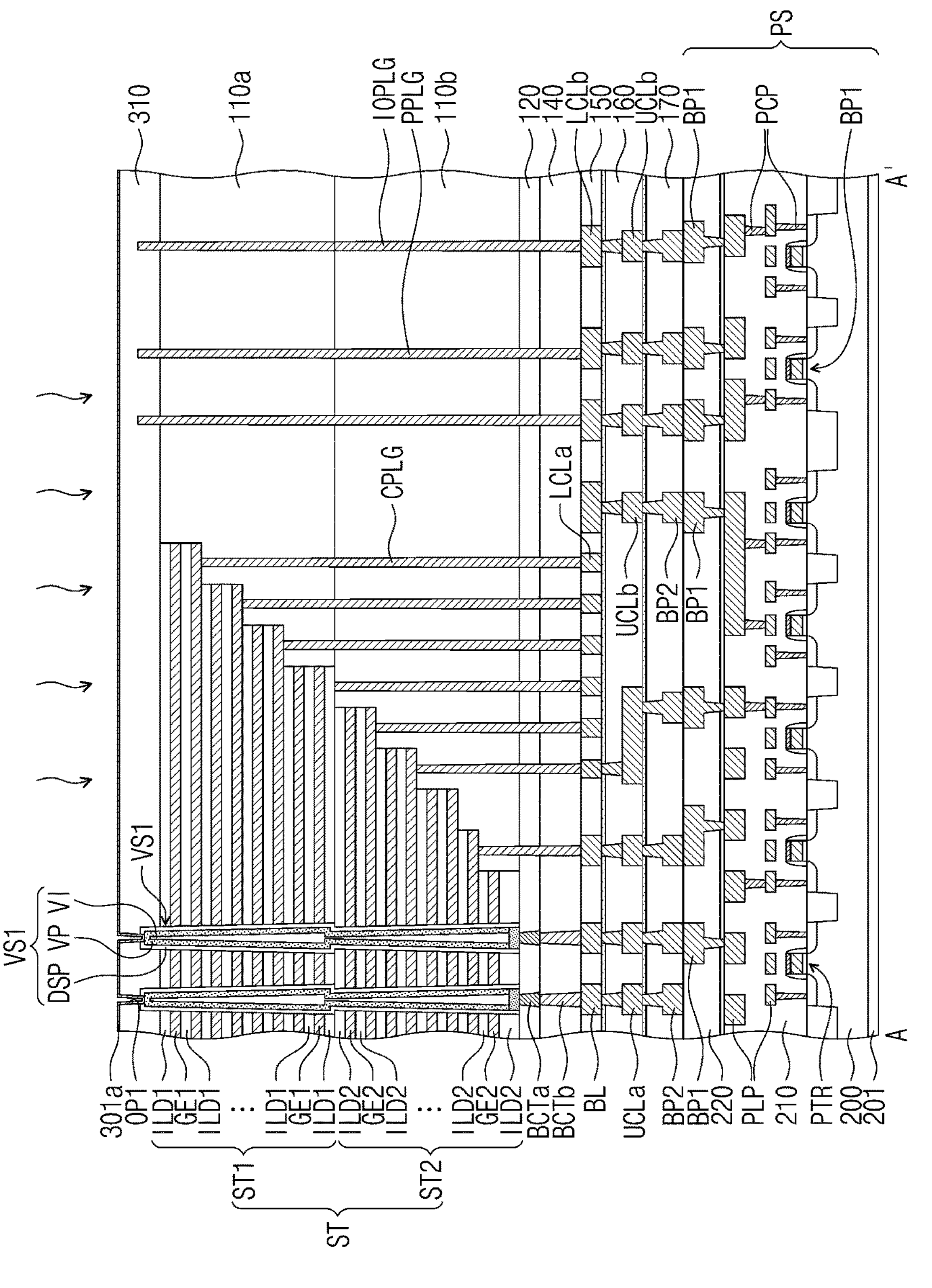
Figure 17B:
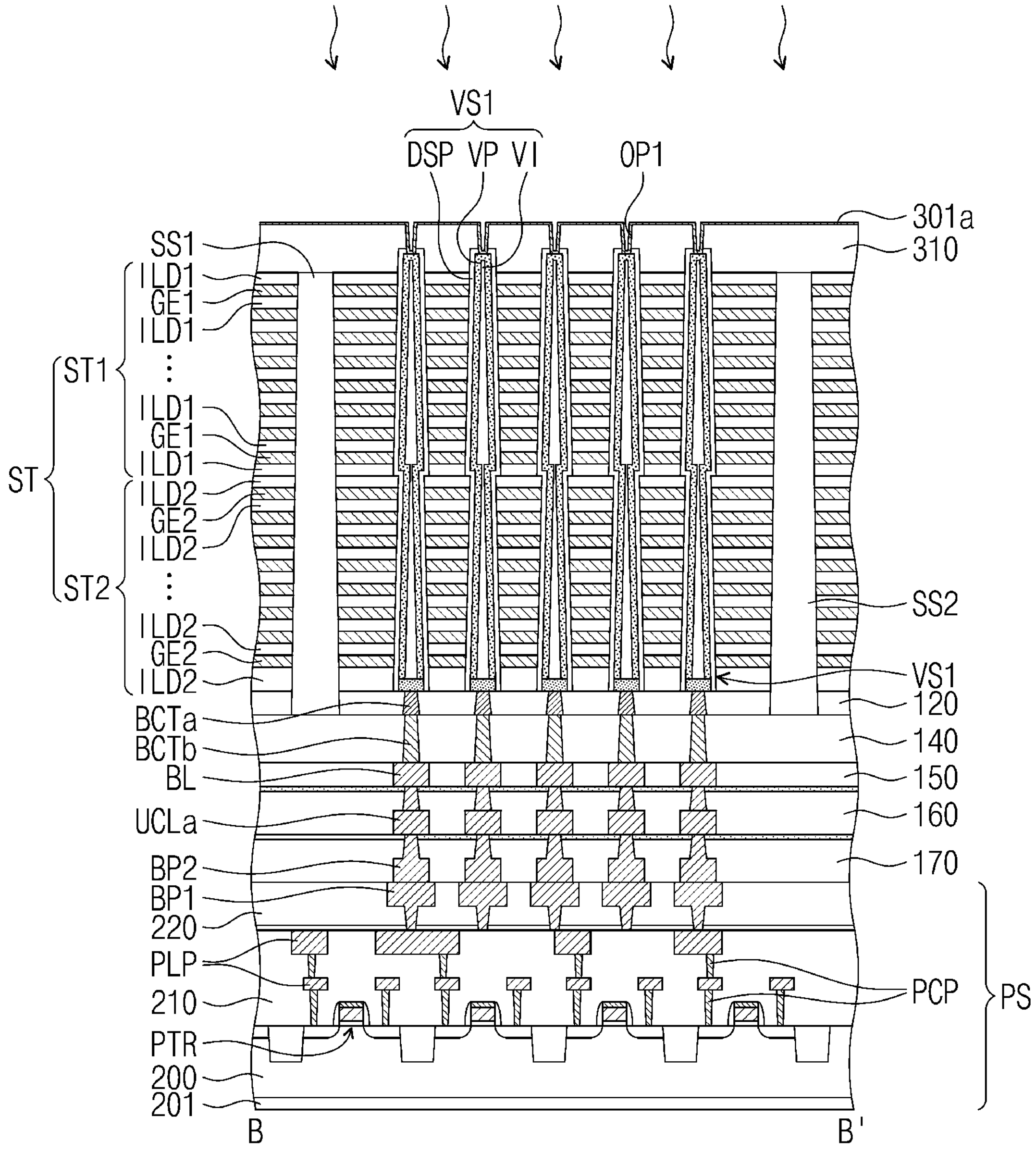

Referring to FIGS. 5, 17A, and 17B, a first preliminary semiconductor layer 301*a*, which is an impurity-doped layer, may be deposited on the first upper insulating layer 310. The first preliminary semiconductor layer 301*a* may be formed using a deposition method (e.g., a chemical vapor deposition (CVD) method or an atomic layer deposition (ALD) method).

The first preliminary semiconductor layer 301*a* may cover the top surface of the first upper insulating layer 310, the inner side surface of the first upper insulating layer 310, the inner side surfaces DSPs1 or DSPs2 (e.g., FIG. 7B) of the data storage patterns DSP, and the top surfaces of the vertical channel patterns VP, which are exposed through the first openings OP1. The first preliminary semiconductor layer 301*a* may be doped with impurities of a first conductivity type (e.g., n-type) during the deposition of the first preliminary semiconductor layer 301*a*. The first preliminary semiconductor layer 301*a* may be formed by depositing an amorphous or polycrystalline silicon layer and performing a thermal treatment process (e.g., a laser annealing process) on the amorphous or polycrystalline silicon layer. The laser annealing process may cause a reduction of a grain boundary of the first preliminary semiconductor layer 301*a*. That is, if the laser annealing process is performed on the first preliminary semiconductor layer 301*a*, a grain size of crystal particles in the first preliminary semiconductor layer 301*a* may be increased. As a result of the laser annealing process, the first preliminary semiconductor layer 301*a* may be activated. The expression "activated" refers to an electric resistance of an element being lowered to a value suitable for applying a voltage required for an operation of the semiconductor device. In an embodiment, as a result of the laser annealing process, an upper portion of the vertical channel pattern VP may also be partially activated.

Figure 18A:
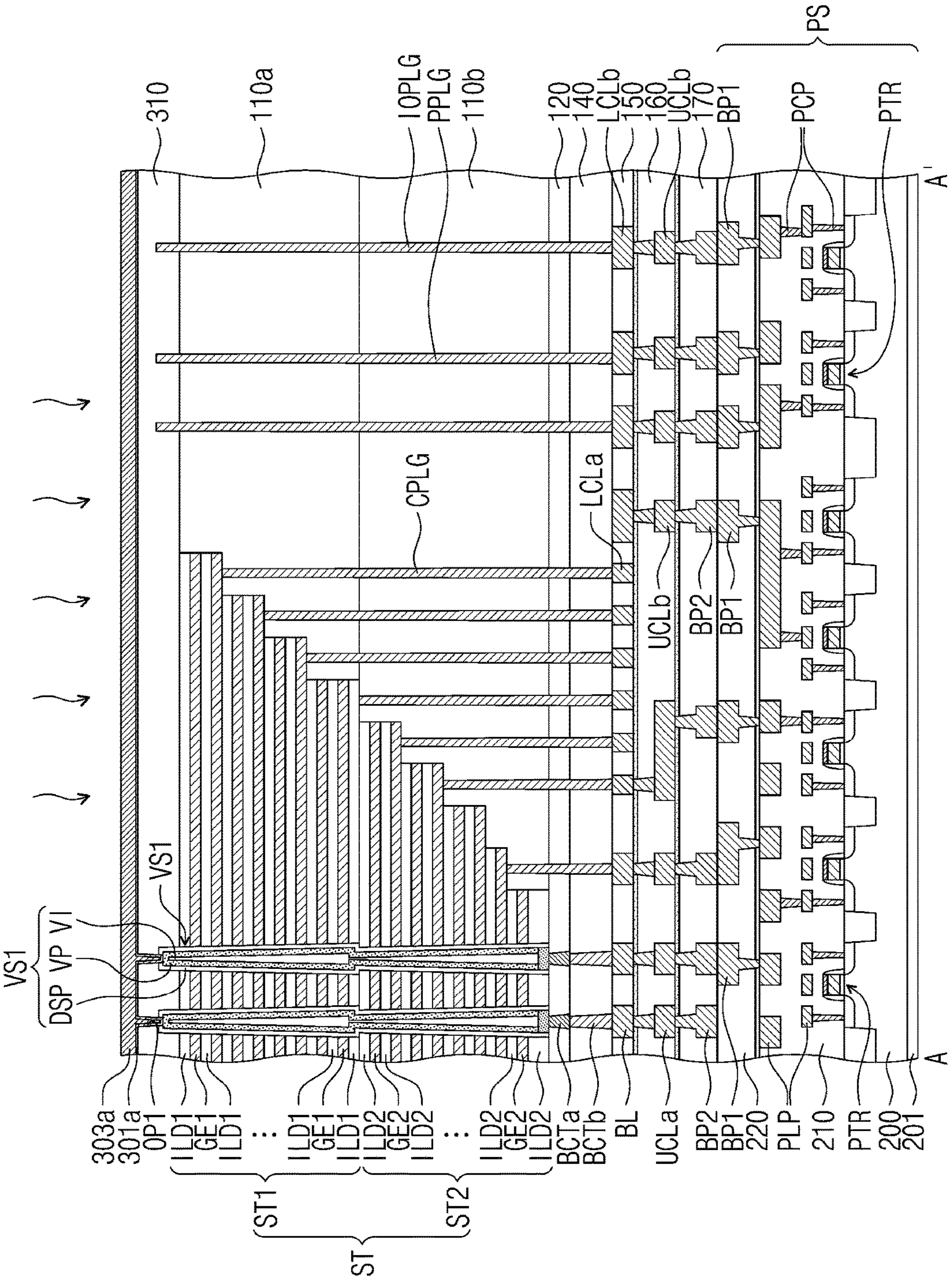
Figure 18B:
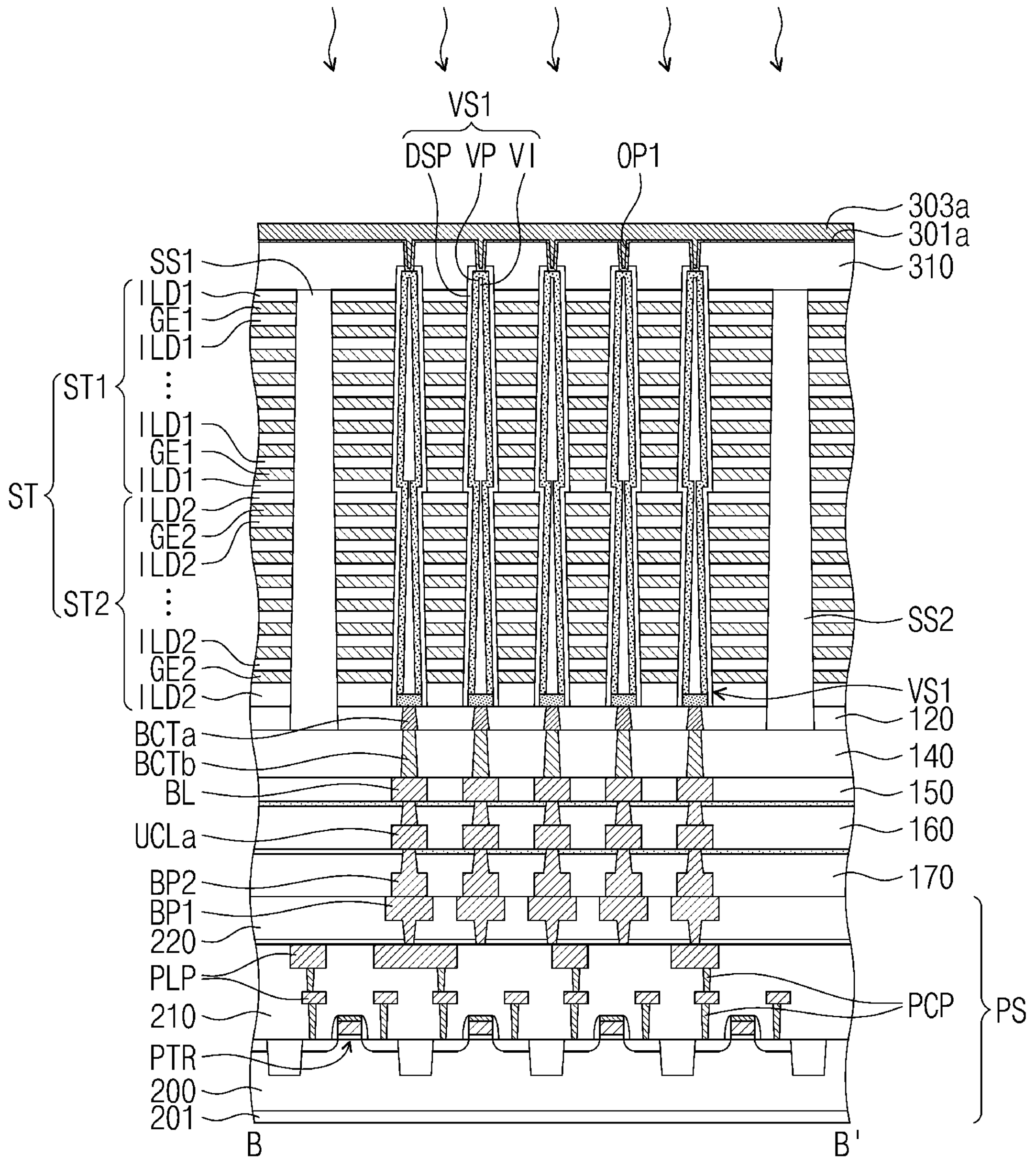

Referring to FIGS. 5, 18A, and 18B, a second preliminary semiconductor layer 303*a* may be formed on the first preliminary semiconductor layer 301*a*. The second preliminary semiconductor layer 303*a* may be formed using a deposition method (e.g., a chemical vapor deposition (CVD) method or an atomic layer deposition (ALD) method).

A laser annealing process may be performed on the second preliminary semiconductor layer 303*a* of the first conductivity type (e.g., n-type) during the deposition of the second preliminary semiconductor layer 303*a*. The second preliminary semiconductor layer 303*a* may be doped with impurities. The second preliminary semiconductor layer 303*a* may be formed by depositing an amorphous or polycrystalline silicon layer and performing a thermal treatment process (e.g., a laser annealing process) on the amorphous or polycrystalline silicon layer. The laser annealing process on the second preliminary semiconductor layer 303*a* may cause a reduction of a grain boundary of the second preliminary semiconductor layer 303*a*. For example, as a result of the laser annealing process on the second preliminary semiconductor layer 303*a*, a grain size of crystal particles in the second preliminary semiconductor layer 303*a* may be increased.

However, since the second preliminary semiconductor layer 303*a* is thicker than the first preliminary semiconductor layer 301*a*, a laser beam may not reach the second preliminary semiconductor layer 303*a* filling the first opening OP1. In this case, a grain size of crystal particles in the first semiconductor layer 301 may be larger than a grain size of the crystal particles in the via portion VIA of the second semiconductor layer 303. In addition, a grain size of the plate portion PLT of the second semiconductor layer 303 may be larger than a grain size of the via portion VIA of the second semiconductor layer 303.

Alternatively, the laser annealing process, which is performed on the second preliminary semiconductor layer 303*a*, may affect not only the second preliminary semiconductor layer 303*a* but also the first preliminary semiconductor layer 301*a*. In this case, the grain boundaries of the crystal particles in both the first and second preliminary semiconductor layers 301*a* and 303*a* may be reduced. For example, the grain size of the crystal particles in the first preliminary semiconductor layer 301*a* may be equal to the grain size of the crystal particles in the second preliminary semiconductor layer 303*a*. This may be changed depending on the temperature and duration of the laser annealing process.

Figure 19A:
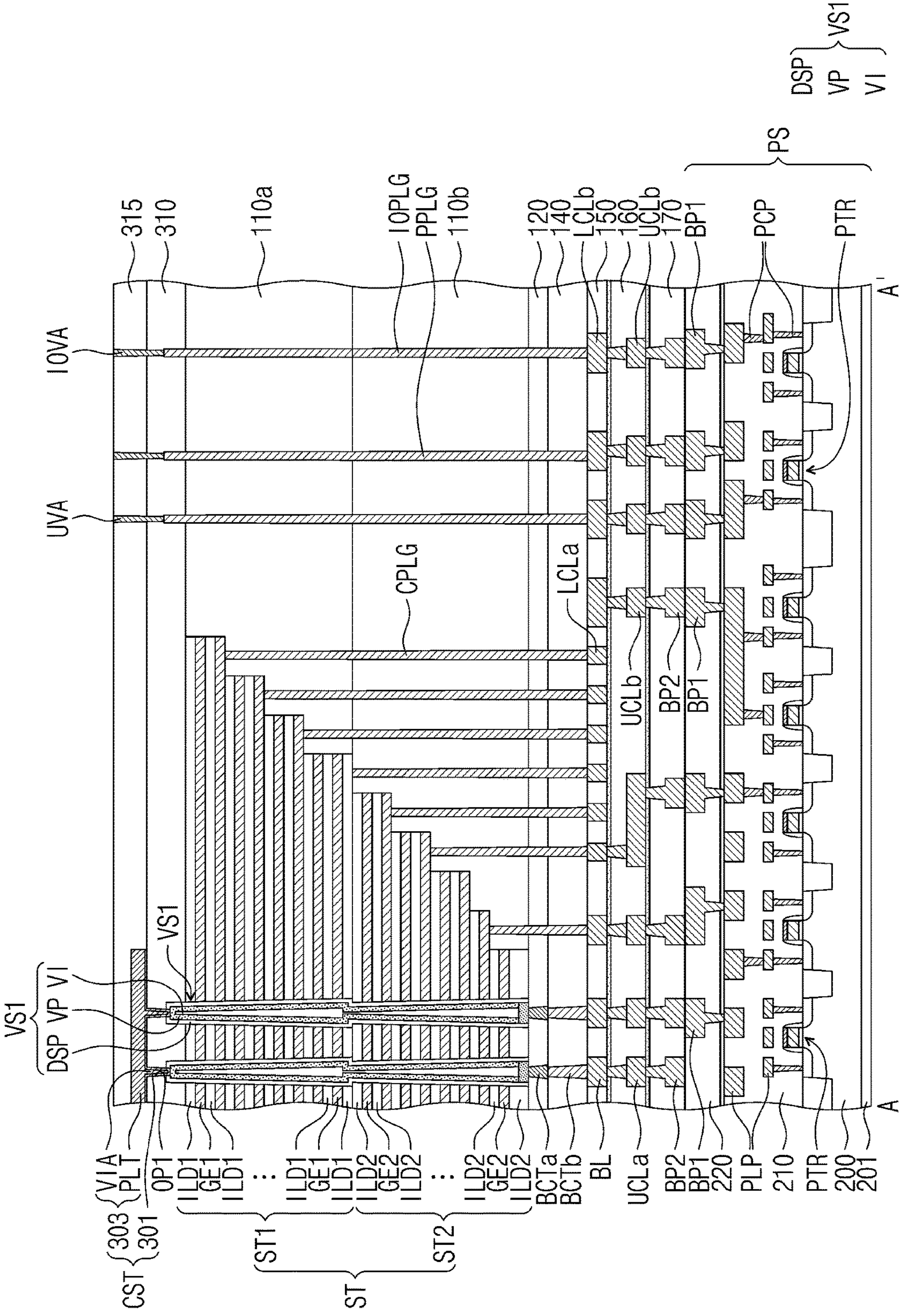
Figure 19B:
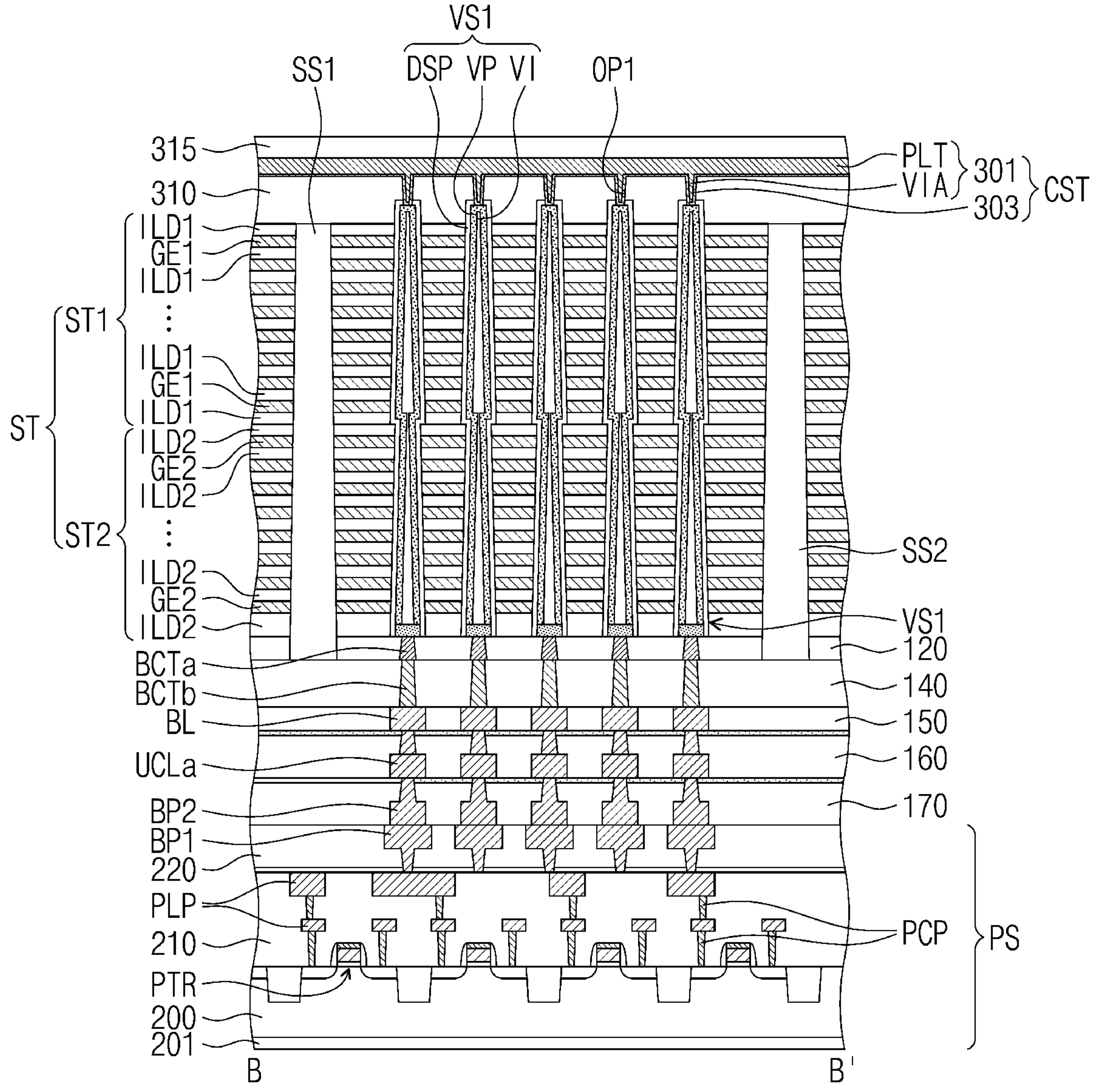

Referring to FIGS. 5, 19A, and 19B, the source structure CST may be formed in the cell array region CAR by patterning the first and second preliminary semiconductor layers 301*a* and 303*a*. The first semiconductor layer 301 may be formed from the first preliminary semiconductor layer 301*a*, and the second semiconductor layer 303 may be formed from the second preliminary semiconductor layer 303*a*. The source structure CST may include the first and second semiconductor layers 301 and 303. Next, the second upper insulating layer 315 may be formed on the source structure CST. The upper vias UVA and the input/output via IOVA may be formed to extend through the second upper insulating layer 315 and the first upper insulating layer 310. The upper vias UVA may be connected to the peripheral contact plugs PPLG, and the input/output via IOVA may be connected to the input/output contact plug IOPLG.

To exploit a gate-induced leakage current (GIDL) phenomenon in an erase operation of the semiconductor device, a distance between the uppermost one of the conductive patterns GE1 and the activated first semiconductor layer 301 may be within a specific range.

According to an embodiment of the present disclosure, the first upper insulating layer 310 may be formed on and/or to cover upper portions of the first vertical structures VS1, upper portions of the peripheral contact plugs PPLG, and an upper portion of the input/output contact plug IOPLG. Then, the anisotropic etching process may be performed on the first upper insulating layer 310 to form the first openings OP1 exposing the vertical channel pattern VP. Next, the first preliminary semiconductor layer 301*a* may be formed to be connected to the vertical channel pattern VP, and then, the laser annealing process may be performed on the first preliminary semiconductor layer 301*a*. In this case, a laser beam can be incident to a portion of the first preliminary semiconductor layer 301*a*, which is in contact with the vertical channel pattern VP, and thus, the first preliminary semiconductor layer 301*a* can be easily activated, despite the limitations associated with the laser beam, such as beam directivity and incident depth. In an embodiment, the first semiconductor layer 301 may be formed from the first preliminary semiconductor layer 301*a*. That is, a distance between the activated first semiconductor layer 301 and the uppermost one of the conductive patterns GE1 may be reduced. Thus, even if the first vertical structures VS1 are extended above the uppermost one of the interlayer insulating layers ILD1 and ILD2 with a large protruding length due to over-recessing, the impact on the erase operation of the semiconductor device is reduced. Due to the above-described reasons, the electrical and reliability characteristics of the semiconductor device may be improved.

In addition, due to the first upper insulating layer 310 being on and/or covering the peripheral and input/output contact plugs PPLG and IOPLG, the laser beam is prevented from being incident to the first and second bonding pads BP1 and BP2 and the peripheral circuit structure PS during the laser annealing process. Accordingly, thermal melting of the first and second bonding pads BP1 and BP2 and the peripheral circuit structure PS may be prevented. Accordingly, a power that is supplied to the semiconductor device during the laser annealing process can be increased, and consequently, this facilitates the activation of the first and second preliminary semiconductor layers 301*a* and 303*a*. As a result, the electrical and reliability characteristics of the semiconductor device may be improved.

Referring back to FIGS. 5, 6A, and 6B, the upper conductive patterns UCP and the input/output pad PAD may be formed on the second upper insulating layer 315. The upper conductive patterns UCP may be connected to the peripheral contact plugs PPLG through the upper vias UVA. The input/output pad PAD may be connected to the input/output contact plug IOPLG through the input/output via IOVA.

The capping insulating layer 320, the protection layer 330, and the passivation layer 340 may be sequentially formed after the formation of the upper conductive patterns UCP and the input/output pad PAD. The capping insulating layer 320 may include, for example, a silicon oxide layer, a silicon nitride layer, or a silicon oxynitride layer. The protection layer 330 may be, for example, a silicon nitride layer or a silicon oxynitride layer. The passivation layer 340 may be formed of or include polyimide-based materials (e.g., photosensitive polyimide (PSPI)). The passivation layer 340 may be formed on the protection layer 330 by a spin coating process.

Next, the second opening OP2, which exposes a portion of the input/output pad PAD, may be formed by partially patterning the capping insulating layer 320, the protection layer 330, and the passivation layer 340.

In a semiconductor device according to an embodiment of the present disclosure, an upper insulating layer and a data storage pattern may be provided to have an opening exposing a vertical channel pattern of a vertical structure in a cell array region. A source structure may include a first semiconductor layer, which is coupled to the vertical channel pattern through the opening, and a second semiconductor layer, which is provided on the first semiconductor layer. Accordingly, a vertical distance between the uppermost one of the conductive patterns and the first semiconductor layer may be reduced. Consequently, it may be possible to induce a gate-induced leakage current (GIDL) phenomenon during an erase operation of the semiconductor device, thereby enhancing the electrical and reliability characteristics of the semiconductor device.

While example embodiments of the present disclosure have been particularly shown and described, it will be understood by one of ordinary skill in the art that variations in form and detail may be made therein without departing from the spirit and scope of the attached claims.

What is claimed is:

1. A semiconductor device, comprising:

a semiconductor substrate;

a peripheral circuit structure on the semiconductor substrate; and a cell array structure on the peripheral circuit structure, the cell array structure comprising:

a stack comprising interlayer insulating layers and conductive patterns that are vertically and alternately stacked;

a first upper insulating layer on the stack;

vertical channel patterns that extend through the stack and the first upper insulating layer;

a data storage pattern on the vertical channel pattern; and a source structure on the first upper insulating layer and connected to the vertical channel patterns, wherein the source structure comprises a first semiconductor layer, wherein the first semiconductor layer comprises a plate portion on the first upper insulating layer, wherein the first semiconductor layer comprises a via portion that extends through the first upper insulating layer and is connected to the vertical channel patterns, and wherein the first upper insulating layer comprises:

a first surface in contact with an upper surface of the data storage pattern;

a second surface in contact with an outer side surface of the data storage pattern; and a third surface in contact with a side surface of the via portion, and wherein the first, second, and third surfaces of the first upper insulating layer are between an upper surface and a lower surface of the first upper insulating layer.

2. The semiconductor device of claim 1, wherein a distance of the upper surface of the data storage pattern from the semiconductor substrate is greater than a distance of an upper surface of the vertical channel patterns from the semiconductor substrate.

3. The semiconductor device of claim 2, wherein the source structure further comprises a second semiconductor layer below the first semiconductor layer, and the via portion is connected to the vertical channel pattern by the second semiconductor layer.

4. The semiconductor device of claim 3, wherein a width of the via portion is less than a width of the upper surface of the vertical channel pattern.

5. The semiconductor device of claim 2, wherein a portion of the vertical channel pattern comprises a first outer side surface, and the data storage pattern is on the first outer side surface of the vertical channel pattern.

6. The semiconductor device of claim 1, wherein the source structure further comprises a second semiconductor layer below the first semiconductor layer, the via portion and the second semiconductor layer comprise a polycrystalline semiconductor material, and a grain size of crystal particles of the second semiconductor layer is greater than or equal to a grain size of crystal particles of the via portion.

7. The semiconductor device of claim 1, wherein the plate portion and the via portion each comprise a polycrystalline material, and wherein a grain size of crystal particles of the plate portion is greater than or equal to a grain size of crystal particles of the via portion.

8. The semiconductor device of claim 1, wherein the peripheral circuit structure comprises peripheral circuits on the semiconductor substrate and first bonding pads connected to the peripheral circuits, and the cell array structure further comprises second bonding pads connected to the first bonding pads.

9. The semiconductor device of claim 1, wherein the source structure further comprises a metal layer covering the first semiconductor layer.

10. The semiconductor device of claim 9, wherein the cell array structure comprises:

a second upper insulating layer on the source structure;

an input/output contact plug laterally spaced apart from the stack and the source structure and connected to the peripheral circuit structure; and an input/output pad on the second upper insulating layer and connected to the input/output contact plug.

11. A semiconductor device, comprising:

a semiconductor substrate;

a peripheral circuit structure on the semiconductor substrate; and a cell array structure on the peripheral circuit structure, the cell array structure comprising:

a stack comprising interlayer insulating layers and conductive patterns that are vertically and alternately stacked;

an upper insulating layer on the stack;

vertical structures that extend through the stack and the upper insulating layer, each of the vertical structures comprising a vertical channel pattern and a data storage pattern on the vertical channel pattern;

a source structure on the upper insulating layer and connected to the vertical channel patterns of the vertical structures, wherein the source structure comprises a first semiconductor layer, wherein the first semiconductor layer is arranged to cover at least a portion of an outer side surface of the vertical channel pattern; and a peripheral contact plug laterally spaced apart from the stack and the source structure and connected to the peripheral circuit structure, wherein the peripheral contact plug comprises a first protruding portion that extends through the upper insulating layer, and wherein the upper insulating layer is on the data storage pattern and a side surface of the first protruding portion.

12. The semiconductor device of claim 11, wherein the data storage pattern is between the upper insulating layer and the vertical channel pattern.

13. The semiconductor device of claim 11, wherein the source structure comprises a second semiconductor layer on the first semiconductor layer, the second semiconductor layer comprises a plate portion on the upper insulating layer and a via portion that extends through the upper insulating layer, and the via portion of the second semiconductor layer is connected to the vertical channel patterns by the first semiconductor layer.

14. The semiconductor device of claim 13, wherein the first and second semiconductor layers comprise a polycrystalline material, and wherein a grain size of crystal particles of the first semiconductor layer is greater than or equal to a grain size of crystal particles of the via portion of the second semiconductor layer.

15. The semiconductor device of claim 11, wherein the cell array structure comprises an input/output contact plug that is laterally spaced apart from the stack, the source structure, and the peripheral contact plug, the input/output contact plug is connected to the peripheral circuit structure, the input/output contact plug comprises a second protruding portion that extends through the upper insulating layer, and the upper insulating layer is on a side surface of the second protruding portion.

16. The semiconductor device of claim 11, wherein the peripheral circuit structure comprises peripheral circuits on the semiconductor substrate and first bonding pads connected to the peripheral circuits, and the cell array structure further comprises second bonding pads connected to the first bonding pads.

17. An electronic system, comprising:

a semiconductor device comprising a semiconductor substrate, a peripheral circuit structure on the semiconductor substrate, and a cell array structure on the peripheral circuit structure; and a controller that is electrically connected to the semiconductor device by an input/output pad, wherein the peripheral circuit structure comprises peripheral circuits that are on the semiconductor substrate, and wherein the peripheral circuit structure comprises first bonding pads that are connected to the peripheral circuits, wherein the cell array structure comprises:

second bonding pads connected to the first bonding pads;

a stack on the second bonding pads, the stack comprising interlayer insulating layers and conductive patterns that are vertically and alternately stacked on the second bonding pads;

an upper insulating layer on the stack;

vertical structures that extend through the stack and the upper insulating layer; and a source structure on the upper insulating layer and connected to the vertical structures, wherein the source structure comprises a first semiconductor layer and a second semiconductor layer on the first semiconductor layer, the first and second semiconductor layers being formed as distinct layers, wherein the second semiconductor layer comprises a plate portion and a via portion that extends through the upper insulating layer and is connected to the vertical structure, wherein each of the vertical structures comprises a vertical channel pattern and a data storage pattern on the vertical channel pattern, wherein the via portion is connected to the vertical channel pattern by the first semiconductor layer, and wherein a distance of an upper surface of the data storage pattern from the semiconductor substrate is greater than a distance of an upper surface of the vertical channel pattern from the semiconductor substrate.

18. The electronic system of claim 17, wherein the data storage pattern is on at least a portion of the upper surface of the vertical channel pattern.

* * * * *